United States Patent
Oh et al.

(10) Patent No.: US 10,083,990 B2
(45) Date of Patent: Sep. 25, 2018

(54) THIN FILM TRANSISTOR SUBSTRATE AND DISPLAY DEVICE USING THE SAME

(71) Applicant: LG Display Co., Ltd., Seoul (KR)

(72) Inventors: Saeroonter Oh, Seoul (KR); Kwanghwan Ji, Seoul (KR); Hyunsoo Shin, Gyeonggi-do (KR); Jeyong Jeon, Gyeonggi-do (KR); Dohyung Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/838,564

(22) Filed: Aug. 28, 2015

(65) Prior Publication Data

US 2016/0064421 A1    Mar. 3, 2016

Related U.S. Application Data

(60) Provisional application No. 62/043,453, filed on Aug. 29, 2014, provisional application No. 62/043,467, filed on Aug. 29, 2014.

(30) Foreign Application Priority Data

Aug. 29, 2014  (KR) .......... 10-2014-0114303
Aug. 29, 2014  (KR) .......... 10-2014-0114306
Aug. 18, 2015  (KR) .......... 10-2015-0115995

(51) Int. Cl.
*H01L 29/10*  (2006.01)
*H01L 27/12*  (2006.01)
(Continued)

(52) U.S. Cl.
CPC ........ *H01L 27/1222* (2013.01); *H01L 27/124* (2013.01); *H01L 27/1218* (2013.01);
(Continued)

(58) Field of Classification Search
CPC ............... H01L 27/124; H01L 27/1218; H01L 27/1222; H01L 27/1251; H01L 27/3262;
(Continued)

(56) References Cited

U.S. PATENT DOCUMENTS 6,822,703 B2   11/2004   Hwang et al.
9,129,927 B2    9/2015   Gupta et al.
(Continued)

FOREIGN PATENT DOCUMENTS

CN         1383214 A    12/2002
CN      203553175 U     4/2014

OTHER PUBLICATIONS

Chinese Office Action, dated Nov. 1, 2017, for the corresponding Chinese patent application No. 201510543178.5.

*Primary Examiner* — Brook Kebede
(74) *Attorney, Agent, or Firm* — Morgan, Lewis & Bockius LLP

(57) ABSTRACT

A thin film transistor (TFT) substrate and a display device using the same are disclosed. The TFT substrate includes a base substrate, a first TFT having a polycrystalline semiconductor and disposed on the base substrate, and a second TFT having an oxide semiconductor and disposed on the first TFT. The second TFT overlaps at least a portion of the first TFT in a plan view.

13 Claims, 15 Drawing Sheets

(51) Int. Cl.
*H01L 29/786* (2006.01)
*H01L 27/32* (2006.01)
*H01L 51/52* (2006.01)

(52) U.S. Cl.
CPC ...... *H01L 27/1251* (2013.01); *H01L 27/1255* (2013.01); *H01L 27/3262* (2013.01); *H01L 27/3272* (2013.01); *H01L 29/7869* (2013.01); *H01L 29/78633* (2013.01); *H01L 29/78672* (2013.01); *H01L 27/322* (2013.01); *H01L 27/3265* (2013.01); *H01L 27/3276* (2013.01); *H01L 51/5209* (2013.01); *H01L 51/5225* (2013.01)

(58) Field of Classification Search
CPC ... H01L 27/3272; H01L 29/04; H01L 29/045; H01L 29/7869; H01L 29/78693
USPC .................................. 257/43; 438/149–166
See application file for complete search history.

(56) References Cited

U.S. PATENT DOCUMENTS

| | | | |
|---|---|---|---|
| 2002/0158995 | A1 | 10/2002 | Hwang et al. |
| 2010/0181574 | A1* | 7/2010 | Liu .................... H01L 27/1229 257/72 |
| 2013/0200365 | A1* | 8/2013 | Yamazaki .......... H01L 29/7869 257/43 |
| 2013/0258746 | A1* | 10/2013 | Kurokawa .......... H01L 27/0688 365/72 |
| 2015/0054799 | A1 | 2/2015 | Chang et al. |
| 2015/0055047 | A1 | 2/2015 | Chang et al. |
| 2015/0055051 | A1 | 2/2015 | Osawa et al. |
| 2015/0236079 | A1 | 8/2015 | Choi |

\* cited by examiner

THIN FILM TRANSISTOR SUBSTRATE AND DISPLAY DEVICE USING THE SAME

This application claims the benefit of priority to Korean Patent Application Nos. 10-2014-0114303, 10-2014-0114306, and 10-2015-0115995 filed on Aug. 29, 2014, Aug. 29, 2014, and Aug. 18, 2015, respectively and U.S. Provisional Application Nos. 62/043,453 and 62/043,467 both filed on Aug. 29, 2014, all of which are incorporated herein by reference for all purposes as if fully set forth herein.

BACKGROUND OF THE INVENTION

Field of the Invention

The present invention relates to a thin film transistor substrate, and more particularly, to a thin film transistor substrate having two different types of thin film transistors thereon, and a display device using the same.

Discussion of the Related Art

As the information society continues to develop, displays for depicting information are increasingly required in various ways to do more. Accordingly, various flat panel displays (FPDs) are developed for overcoming many drawbacks of the cathode ray tube (CRT), such as heavy weight and large volume. The flat panel displays include liquid crystal displays (LCDs), plasma display panels (PDPs), the organic light emitting displays (OLEDs) and electrophoresis displays (EDs).

The display panel of a flat panel display may include a thin film transistor substrate having a thin film transistor in each pixel region arranged in a matrix format. For example, a liquid crystal display (LCD) displays video data by controlling the light transitivity of the liquid crystal layer using the electric fields applied across the liquid crystal layer. An organic light emitting diode display displays the video data by generating properly controlled light at each pixel disposed in a matrix manner as an organic light emitting diode is formed therein.

As a self-emitting display device, the organic light emitting diode display has the advantages of a fast response time, high brightness and a large viewing angle. An organic light emitting diode display (OLED) using organic light emitting diodes of a high energy efficiency can be categorized as a passive matrix type organic light emitting diode display (PMOLED) or an active matrix type organic light emitting diode display (AMOLED).

As the development of personal electronic devices is becoming more active, display devices are being developed as highly portable and/or wearable devices. To incorporate a display device into a portable and/or wearable device, it is typically desirable for the display device to have low power consumption. However, with the conventional display technologies that have been developed to date, there are limitations on reducing power consumption.

SUMMARY OF THE INVENTION

Accordingly, the present invention is directed to a thin film transistor substrate and display device using the same that substantially obviates one or more of the problems due to limitations and disadvantages of the related art.

An object of the present invention is to provide a thin film transistor substrate for flat panel display having at least two transistors of different characteristics on the same substrate.

Another object of the present invention is to provide a thin film transistor substrate for flat panel display having two different types of transistors manufactured by a more efficient manufacturing processes and with a reduced number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate comprises a base substrate; a first thin film transistor (TFT) including a polycrystalline semiconductor and disposed on the base substrate; and a second TFT having an oxide semiconductor and disposed on the first TFT, wherein the second TFT overlaps at least a portion of the first TFT in a plan view.

In another aspect, a display device comprises a display panel configured to display an input image; and a display panel driving circuit configured to output data to the display panel, wherein the display panel includes a substrate, a first thin film transistor (TFT) having a polycrystalline semiconductor and disposed on the substrate, and a second TFT having an oxide semiconductor and disposed on the first TFT, and wherein the second TFT overlaps at least a portion of the first TFT in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain principles of the invention. In the drawings.

DETAILED DESCRIPTION OF THE ILLUSTRATED EMBODIMENTS

Figure 1:
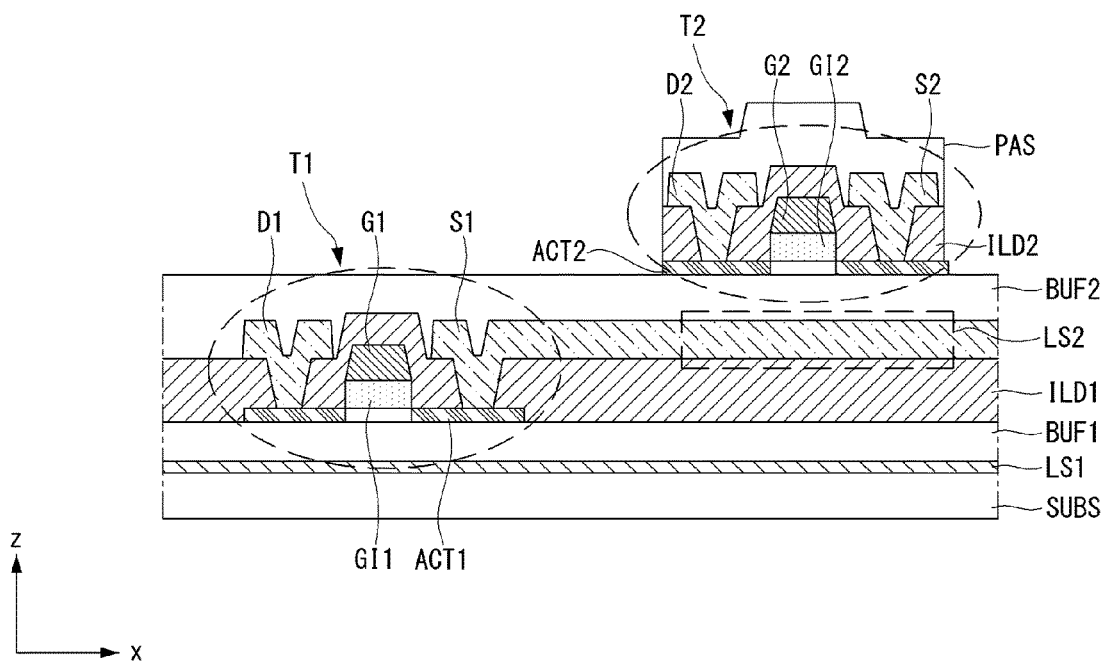
FIG. 1 is a cross-sectional view illustrating a thin film transistor (TFT) substrate for a flat panel display according to a first example embodiment of the present invention.

Reference will now be made in detail to embodiments of the present invention, which are illustrated in the accompanying drawings. Like reference numerals designate like elements throughout the detailed description. However, the present invention is not restricted by these example embodiments but various changes or modifications can be made without departing from the principle or spirit of the invention. In the following example embodiments, the names of the elements are selected for ease of explanation and may be different from names used in actual products.

As used herein, unless otherwise specified, the term "on" broadly encompasses both "directly on" and "indirectly on". Also, unless otherwise specified, the term "under" broadly encompasses both "directly under" and "indirectly under".

The thin film transistor substrate for a flat panel display according to example embodiments of the present invention may comprise a first thin film transistor disposed in a first area of the substrate and a second thin film transistor disposed in a second area of the same substrate. The substrate may include a display area and a non-display area. In the display area, a plurality of pixel areas is arranged in a matrix format. In a pixel area, display elements for implementing a display function are disposed. In the non-display area neighboring the display area, driver elements for driving the display elements in the display area are disposed.

Here, the first area may be the non-display area, and the second area may be some or all portions of the display area. In this example, the first thin film transistor and the second thin film transistor may be disposed substantially apart from each other. In another example, the first area and the second area may both be included in the display area. In particular, in an example where a plurality of thin film transistors are disposed in one pixel area, the first thin film transistor and the second thin film transistor may be disposed near each other.

As the polycrystalline semiconductor material has the characteristics of high mobility (over 100 cm$^2$/Vs), low power consumption, and high reliability, it may be suitable for use in thin film transistors in such driver elements as a gate driver and/or a multiplexer (MUX) for driving the display elements. In addition, it may be suitable for use in a driving thin film transistor disposed in the pixel area of an organic light emitting diode display. On the other hand, as the oxide semiconductor material has low off-current, it may be suitable for use in the channel layer of a switching element, such as a thin film transistor (TFT), in the pixel area, which typically has a very short ON time period and a long OFF time period. Further, as the off-current is low, the holding time of the pixel voltage may be long. Off-current is a leakage current flowing in a transistor when the transistor is in an OFF state. Because the off-current is low, the holding time of the pixel voltage may be long. Thus, a thin film transistor using the oxide semiconductor material is suitable for use in a display requiring low frequency driving and/or low power consumption. By disposing these two different types of thin film transistors on the same substrate, the present invention provides a thin film transistor substrate having an optimized function and characteristic for the portable and/or wearable displays. Since the TFT having an oxide semiconductor layer has low off-current, standby power consumption may be considerably reduced, and power consumption may be minimized for low-speed driving or driving at a low refresh rate.

When a semiconductor layer is formed using the poly crystalline semiconductor material, a doping process and a high temperature treatment process are required. In contrast, when a semiconductor layer is formed using an oxide semiconductor material, a relatively low temperature process may be used. Therefore, the poly crystalline semiconductor layer, typically formed under more sever heat conditions, may be formed first, and then, the oxide semiconductor layer may be formed thereafter.

When a gate driving circuit (or a gate driver) is disposed within the non-display area of the substrate, first and second TFTs may be formed as C-MOS type thin film transistors. For example, the P-MOS type thin film transistor and the N-MOS type thin film transistor having the poly crystalline semiconductor layers are disposed in the gate driver disposed in the non-display area. In that case, to form a low density doping area (LDD area) for the N-MOS type thin film transistors, many photo-mask processes may be required. Here, the N-MOS type thin film transistor having the poly crystalline semiconductor material may be replaced with a thin film transistor having an oxide semiconductor material so that the LDD area may not be required, and the total number of photo-mask processes can be simplified and/or reduced.

First Example Embodiment

With reference to FIG. 1, a first example embodiment of the present invention will be explained. FIG. 1 is a cross-sectional view illustrating a thin film transistor (TFT) substrate for a flat panel display according to the first example embodiment of the present invention. Here, the cross sectional views, rather than plane views, are provided to show the main features more clearly.

As shown in FIG. 1, a thin film transistor (TFT) for a flat panel display according to the first example embodiment of the present disclosure may include a first TFT T1 and a second TFT T2 disposed on a base substrate SUBS (hereinafter referred to as a "substrate"). The first and second TFTs T1 and T2 may have a coplanar structure as illustrated in FIG. 1, but the present disclosure is not limited thereto. For example, the first and second TFTs T1 and T2 may be manufactured with a structure in which bottom-gate and top-gate structures are vertically combined.

A first semiconductor pattern ACT1 of a first TFT T1 includes a polycrystalline semiconductor material such as low temperature polysilicon. A second semiconductor pattern ACT2 of a second TFT T2 includes an oxide semiconductor. The oxide semiconductor may include an InGaZnO-based material, but the present disclosure is not limited thereto and it may be an oxide semiconductor including one or more metals among In, Ga, Zn, Al, Sn, Zr, Hf, Cd, Ni, and Cu.

When the oxide semiconductor of the second TFT T2 is exposed to light, a leakage current may be generated and driving characteristics are severely degraded. A light shield layer (or a light blocking layer) is required to prevent irradiation of light to the second TFT T2. To this end, a dual-light shield layer is applied to the TFT substrate to prevent exposure of the second TFT T2 to light.

Here, a first light shield layer LS1 is formed below the first and second TFTs T1 and T2. The first light shield layer LS1 blocks light irradiated to the first and second TFTs T1 and T2.

At least one of a drain D1 and a source S1 of the first TFT T1 extends to a lower portion of the second TFT T2 so as to be utilized as a second light shield layer LS2 of the second TFT T2. At least one of the drain D1 and source S1 of the first TFT T1 is integrated with the second light shield layer LS2. Thus, at least a portion of the second TFT T2 overlaps the first TFT T1 in a thickness direction or a vertical direction of the substrate SUBS. In FIG. 1, the source S1 of the first TFT T1 may be utilized as the second light shield layer LS2, but the present disclosure is not limited thereto. The second light shield layer LS2 extends to a lower portion of the second TFT T2 to block light incident to the second TFT T2. Thus, in the present disclosure, optical reliability of the second TFT T2 may be improved due to the dual-light shield effect.

The floating light shield layer causes a drain-induced barrier lowering phenomenon DIBL of the oxide semiconductor transistor. The floating light shield layer is not connected to an external power source. In contrast, since the second light shield layer LS2 of the present disclosure is connected to the first TFT T1, it is not floated, thereby preventing the DIBL phenomenon of the second TFT T2.

At least one of the drain D1 and the source S1 may be utilized as the second light shield layer LS2, an additional light shield layer is not formed between the first TFT T1 and the second TFT T2. Thus, during a manufacturing process, there is no need to add a photo mask process for patterning the additional light shield layer.

A first buffer layer BUF1 is formed on the entire surface of the substrate SUBS. According to circumstances, the buffer layer BUS may be omitted. Alternatively, the first buffer layer BUF1 may have a structure in which a plurality of thin film layers is stacked. Here, for the purposes of description, the first buffer layer BUF1 will be described as a single layer.

The first TFT T1 includes a gate G1 formed on the first buffer layer BUF1 and a source S1 and a drain D1 formed on a first interlayer insulating layer ILD1. The source S1 and the drain D1 are in contact with the polycrystalline semiconductor material layer of the first semiconductor pattern ACT1 through a contact hole penetrating through the first interlayer insulating layer ILD1. A first gate insulating layer GI1 is disposed between the gate G1 and the polycrystalline semiconductor material layer of the first semiconductor pattern ACT1. The first interlayer insulating layer ILD1 isolates the source S1 and the drain D1 from the gate G1. The first interlayer insulating layer ILD1 may be formed on the first buffer layer BUF1.

A second buffer layer BUF2 is formed on the first interlayer insulating layer ILD1 to cover the first TFT T1. The second buffer layer BUF2 serves as a protective layer or a passivation layer protecting the first TFT T1. Also, the second buffer layer BUF2 planarizes the surface on which the second TFT T2 is disposed.

The second TFT T2 includes a gate G2 formed on the second buffer layer BUF2, and a source S2 and a drain D2 formed on a second interlayer insulating layer ILD2. The source S2 and the drain D2 are in contact with both sides of the second semiconductor pattern ACT2 through a contact hole penetrating through the second interlayer insulating layer ILD2. A second gate insulating layer GI2 is disposed between the gate G2 and the second semiconductor pattern ACT2. The second interlayer insulating layer ILD2 isolates the source S2 and the drain D2 from the gate G2. A passivation layer PAS covers the second TFT T2.

The gates G1 and G2 of the first and second TFTs T1 and T2 are formed of a metal, such as Mo, Al, or Cu. The gate G1 pattern of the first TFT T1 may be utilized as an alignment key defining an N+ doping region in the first semiconductor pattern ACT1 during a manufacturing process.

The gate insulating layers GI1 and GI2, the interlayer insulating layers ILD1 and ILD2, and the passivation layer PAS may include any one insulating material among SiOx, SiNx, SiOxNy, AlOx, HfOx, and TiOx, but the present disclosure is not limited thereto. For example, the insulating material may be an oxide, a nitride, or an oxynitride including at least one of Si, Ge, Al, Hf, Ti, In, Ga, Gd, La, and Ta. The gate insulating layers GI1 and GI2, the interlayer insulating layers ILD1 and ILD2, and the passivation layer PAS may be formed of the aforementioned insulating material layer as a single layer or may be formed to have a structure in which the aforementioned insulating material layers are stacked, and thicknesses thereof may range from 100 Å to 7000 Å.

Hereinafter, a method for manufacturing a TFT substrate for a flat panel display according to the first example embodiment of the present disclosure will be described with further reference to FIGS. 2A-2J.

Figure 2A:
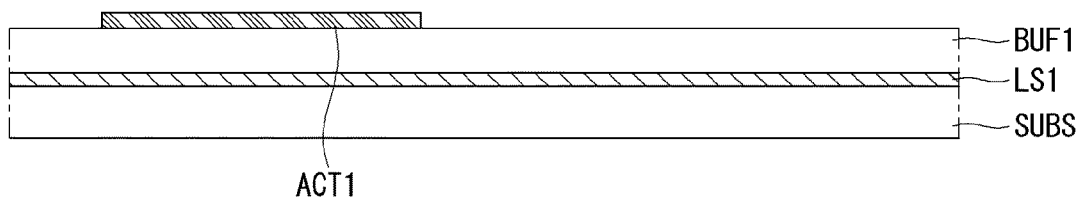
FIGS. 2A-2J are cross-sectional views illustrating a process of manufacturing a TFT substrate for a flat panel display according to the first example embodiment of the present invention.

As illustrated in FIG. 2A, a first light shield layer LS1 is formed on a substrate SUBS, and a first buffer layer BUF1 is formed thereon. Subsequently, an amorphous silicon (a-Si) material is deposited on the first buffer layer BUF1 and crystallization is performed thereon to form polycrystalline silicon. The polycrystalline silicon material is patterned through a first photo mask process to form a first semiconductor pattern ACT1.

Figure 2B:
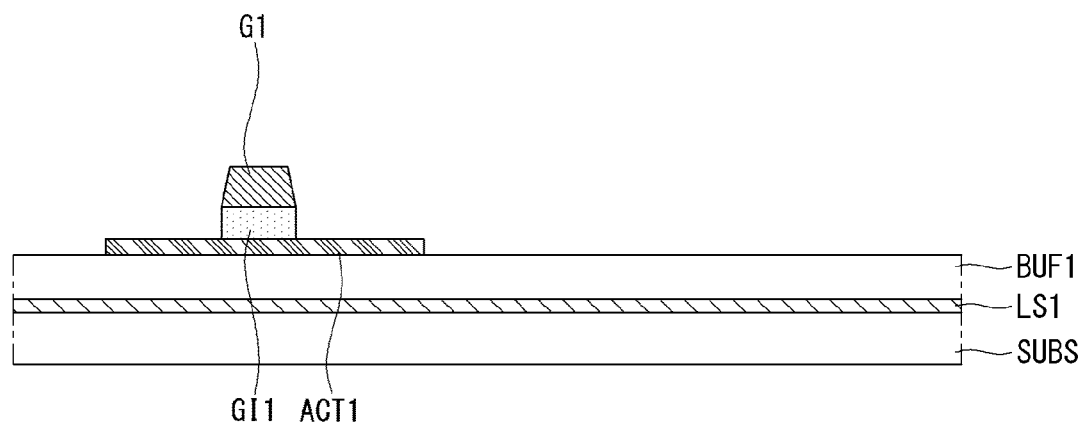

In FIG. 2B, an insulating material and a first metal are continuously deposited on the first buffer layer BUF1 with the first semiconductor pattern ACT1 formed thereon and patterned through a second photo mask process to form a first gate insulating layer GI1 and a first gate G1 on the first semiconductor pattern ACT1.

Figure 2C:
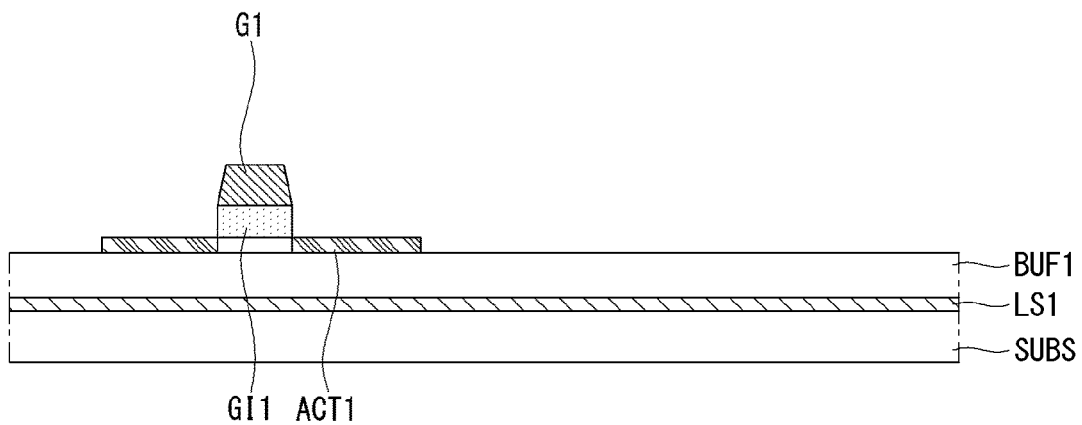

Subsequently, as shown in FIG. 2C, N+ ions (impurity) are implanted in the first semiconductor pattern ACT1 using the first gate G1 pattern as an alignment key during a third photo mask process. Since the first gate G1 pattern covers a central channel region of the first semiconductor pattern ACT1, the impurity is doped only on both sides of the first semiconductor pattern ACT1. As a result, a channel region is defined between the impurity-doped source region and drain region in the first semiconductor pattern ACT1.

Figure 2D:
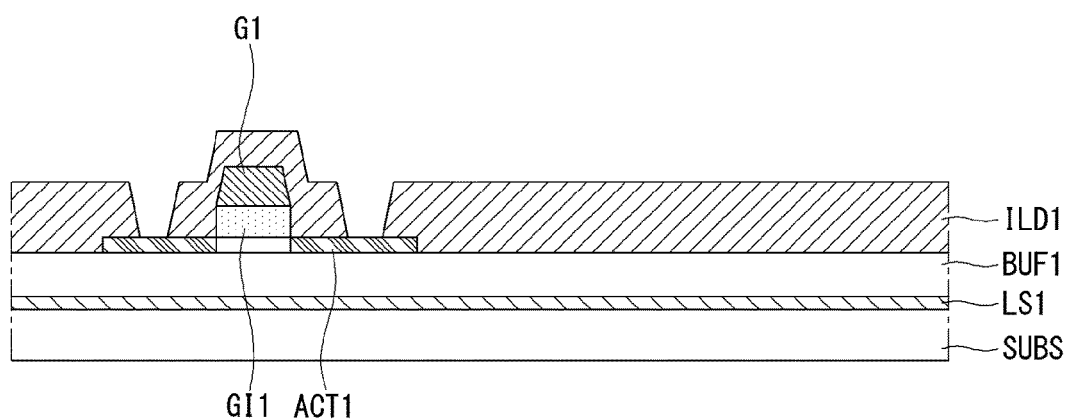

With reference to FIG. 2D, an insulating material is deposited to cover the first gate G1 and the first semiconductor pattern ACT1 and patterned through a fourth photo mask process to form a first interlayer insulating layer ILD1. Here, the first interlayer insulating layer ILD1 is partially etched to form contact holes exposing the source region and the drain region of the first semiconductor pattern ACT1.

Figure 2E:
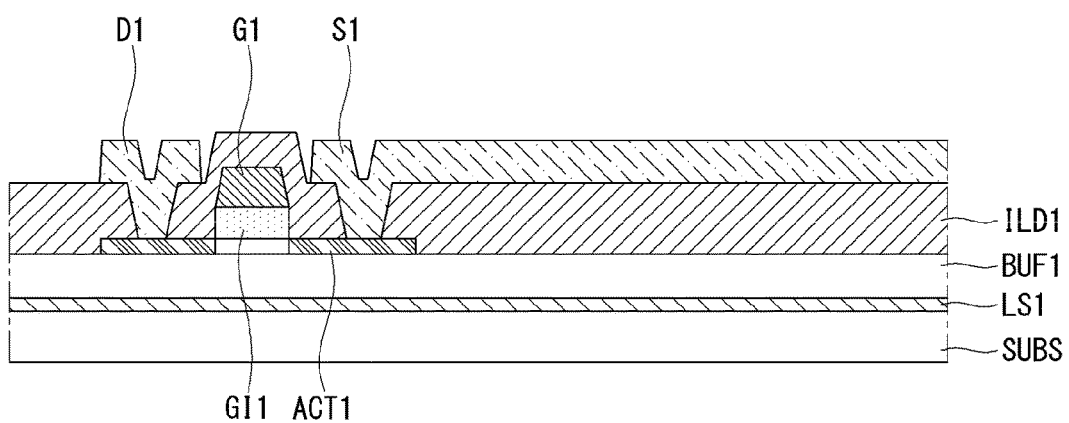

Then, as illustrated in FIG. 2E, a second metal is deposited to cover the first interlayer insulating layer and patterned through a fifth photo mask process to form a first source S1 and a first drain D1. The first source S1 and the first drain D1 are in contact with the first semiconductor pattern ACT1 through the contact holes penetrating through the first interlayer insulating layer ILD1. At least one of the first source S1 and the first drain D1 extends to a lower side of the second TFT T2 to serve as a second light shield layer.

Figure 2F:
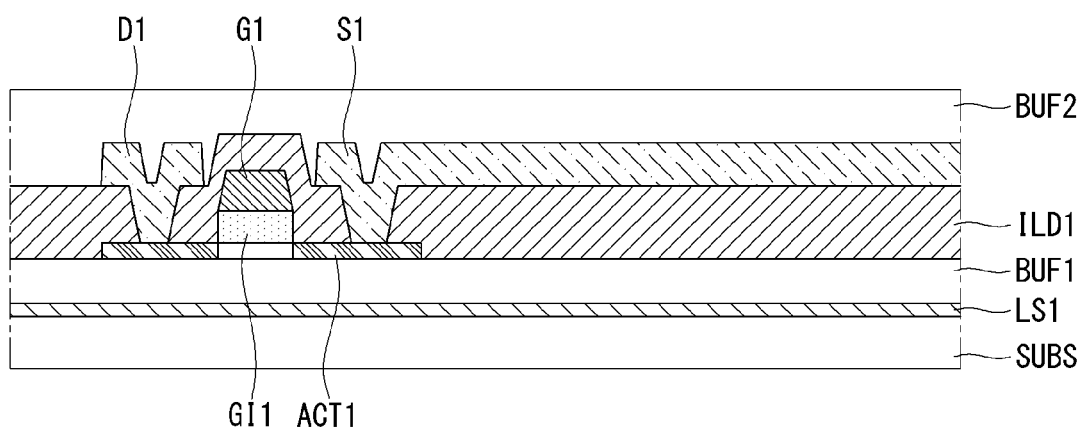

In FIG. 2F, a second buffer layer BUF2 is formed on the first interlayer insulating layer ILD1 to cover the first source S1 and the first drain D1 for planarization. The second buffer layer BUF2 may be patterned through a sixth photo mask process to form a contact hole exposing a first metal layer pattern and a second metal layer pattern in a pad region.

Figure 2G:
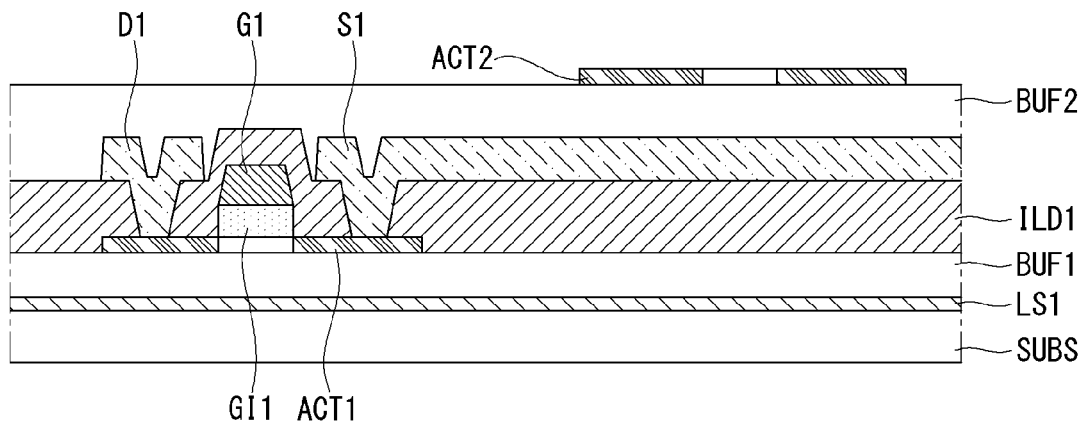

As illustrated in FIG. 2G, an oxide semiconductor material is deposited on the second buffer layer BUF2 and patterned through a seventh photo mask process to form a second semiconductor pattern ACT2.

Figure 2H:
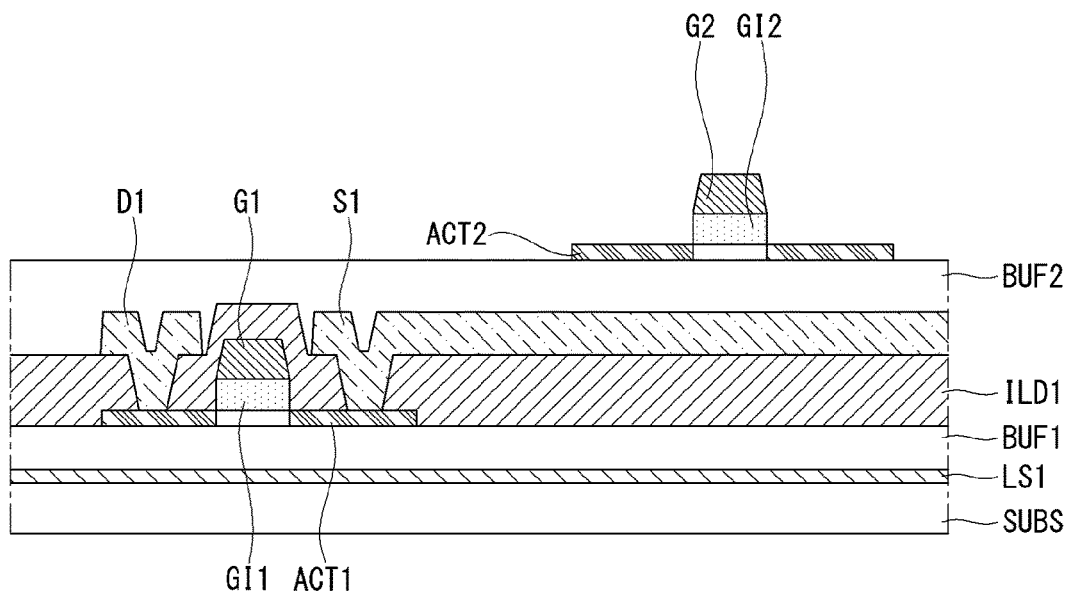

With reference to FIG. 2H, an insulating material and a third metal are continuously deposited on the second buffer layer BUF2 with the second semiconductor pattern ACT2 formed thereon and patterned through an eighth photo mask process to form a second gate insulating layer GI2 and a second gate G2 on the second semiconductor pattern ACT2. Here, a surface of the oxide semiconductor exposed during a dry etching process of the second gate insulating layer GI2 and the second gate G2 is metalized.

Figure 2I:
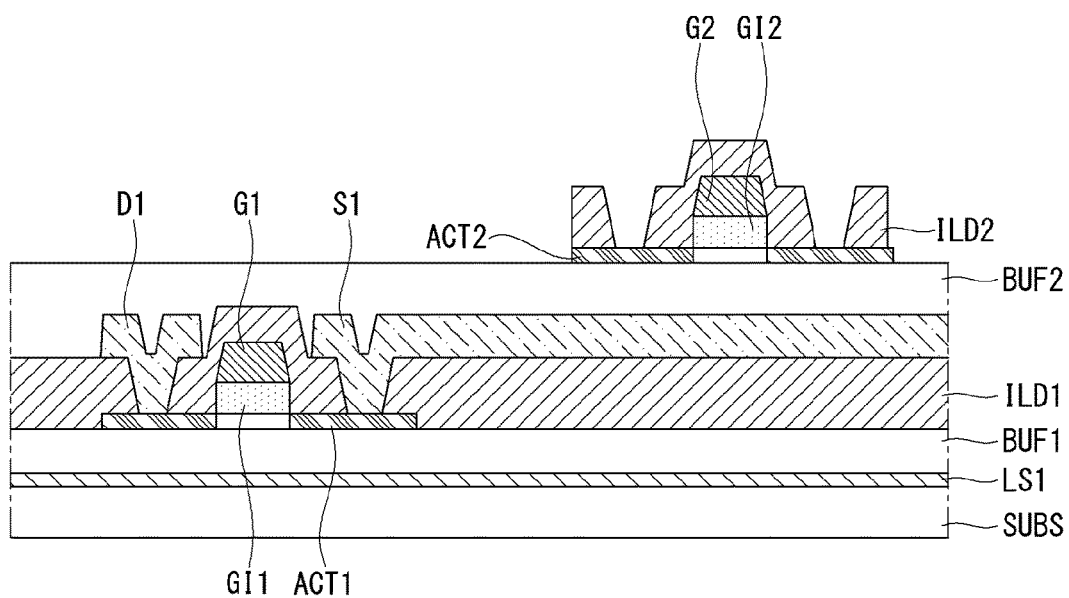

Thereafter, in FIG. 2I, an insulating material is deposited to cover the second gate G2 and the second semiconductor pattern ACT2 and patterned through a ninth photo mask process to form a second interlayer insulating layer ILD2. Here, the second interlayer insulating layer ILD2 is partially etched to form contact holes exposing a source region and a drain region of the second semiconductor pattern ACT2.

Figure 2J:
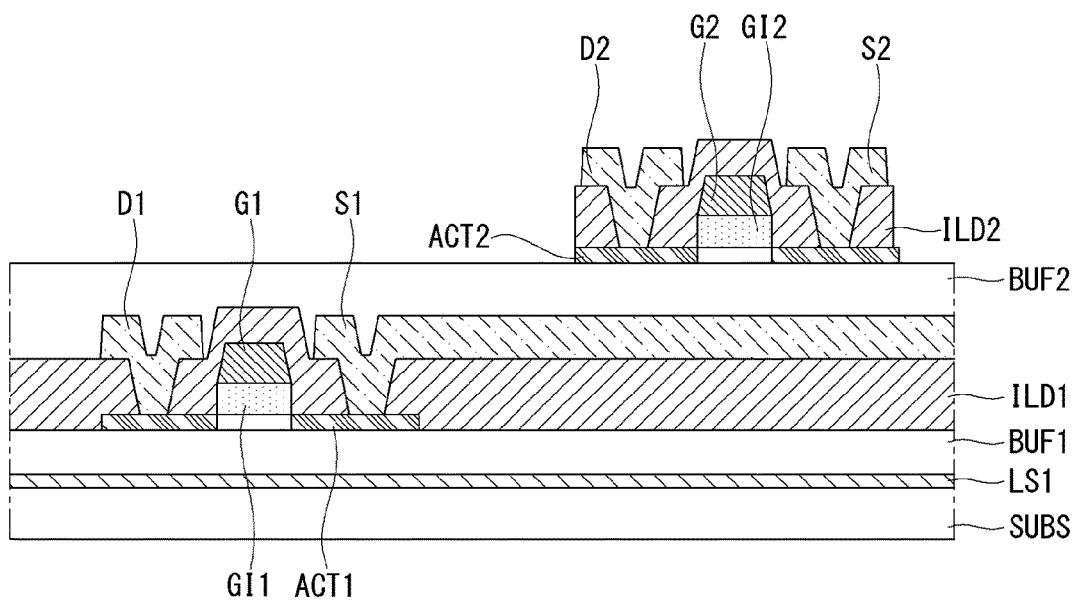

With reference to FIG. 2J, a fourth metal is deposited to cover the second interlayer insulating layer ILD2 and patterned through a tenth photo mask process to form a second source S2 and a second drain D2. The second source S2 and the second drain D2 are in contact with the second semiconductor pattern ACT2 through the contact holes penetrating through the second interlayer insulating layer ILD2. Subsequently, an insulating material is deposited on the second interlayer insulating layer ILD2 and the second buffer layer BUF2 to cover the first source S1 and the first drain D1, and patterned through an eleventh photo mask process to form a passivation layer PAS.

Figure 3:
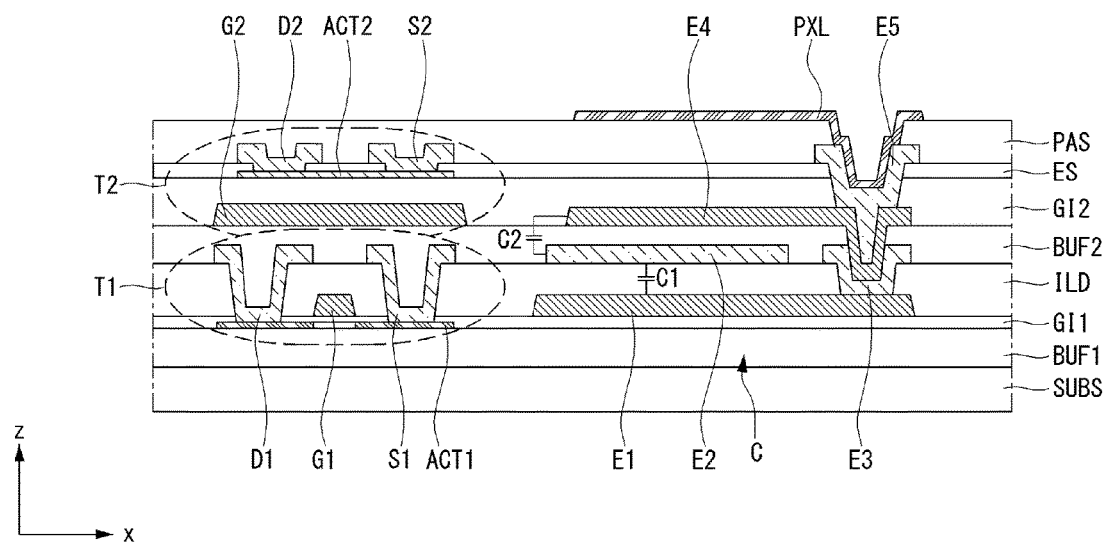
FIG. 3 is a cross-sectional view illustrating a thin film transistor (TFT) substrate for a flat panel display according to a second example embodiment of the present invention.
Figure 4:
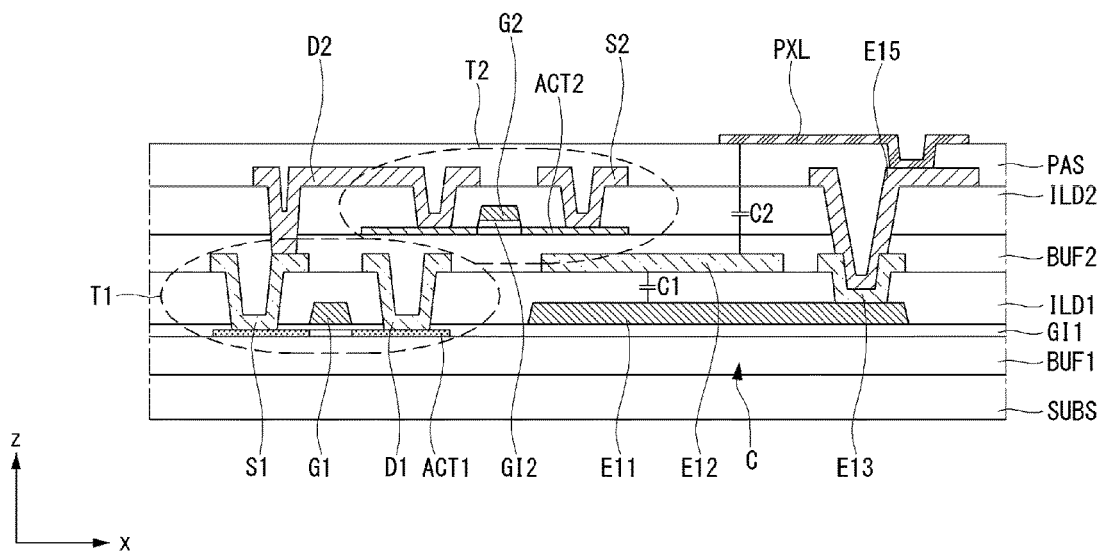
FIG. 4 is a cross-sectional view illustrating a thin film transistor (TFT) substrate for a flat panel display according to a third example embodiment of the present invention.

In an organic light emitting display device or a liquid crystal display device of example embodiments, a single switching element may be implemented to have a structure in which the first TFT T1 and the second TFT T2 are connected. In this case, due to the advantages of the first TFT having high mobility and high reliability and the advantages of the second TFT having low OFF current, stable driving characteristics may be secured, power consumption may be lowered in a standby mode and in driving at a low speed, and a refresh rate may be further lowered at the low driving speeds. When the first TFT T1 and the second TFT T2 are distributed on a plane, an aspect ratio of pixels is lowered. The first and second TFTs are vertically disposed as illustrated in FIGS. 3 and 4, thereby minimizing the disposition area to prevent a degradation of the aspect ratio of pixels. When the first and second TFTs T1 and T2 are applied to a driving circuit within a bezel region, the bezel region may be narrowed.

Second Example Embodiment

FIG. 3 is a cross-sectional view illustrating a thin film transistor (TFT) substrate for a flat panel display according to a second example embodiment of the present invention.

With reference to FIG. 3, the thin film transistor (TFT) substrate for a flat panel display according to the second embodiment includes a first TFT T1 disposed on a substrate SUBS and a second TFT T2 disposed on the first TFT T1. At least a portion of the second TFT T2 overlaps the first TFT T1 in a thickness direction or in a vertical direction (z).

A first semiconductor pattern ACT1 of the first TFT T1 includes a polycrystalline semiconductor material, such as LTPS. A first buffer layer BUF1 may be formed on the substrate SUBS and the first semiconductor pattern ACT1 may be formed on the first buffer layer BUF1. A light shield layer may be formed between the substrate SUBS and the first buffer layer BUF1. The first TFT T1 includes a first gate G1 disposed on the first semiconductor pattern ACT1, a first source S1 in contact with a source region of the first semiconductor pattern ACT1, and a first drain D1 in contact with a drain region of the first semiconductor pattern ACT1. The first gate G1 overlaps the first semiconductor pattern ACT1 with a first gate insulating layer GI1 interposed therebetween. The first source S1 and the first drain D1 are separated from the first gate G1 with an interlayer insulating layer ILD and the first gate insulating layer GI interposed therebetween. The first source S1 and the first drain D1 are in contact with the first semiconductor pattern ACT1 through contact holes penetrating through the interlayer insulating layer ILD and the first gate insulating layer GI. The second buffer layer BUF2 covers the first TFT T1 and planarizes a surface on which the second TFT T2 is formed.

The second semiconductor pattern ACT2 of the second TFT T2 includes an oxide semiconductor. The second TFT T2 includes a second gate G2 formed on the second buffer layer BUF2, a second source S2 in contact with a source region of the second semiconductor pattern ACT2, and a second drain D2 in contact with a drain region of the second semiconductor pattern ACT2. The second gate G2 is disposed below the second semiconductor pattern ACT2. The second gate G2 overlaps the second semiconductor pattern ACT2 with a second gate insulating layer GI2 interposed therebetween. The second source S2 and the second drain D2 are in contact with the second semiconductor pattern ACT2 through contact holes penetrating through an etch stopper layer ES. The etch stopper layer ES protects the second semiconductor pattern ACT2 from an etchant when the second source S2 and the second drain D2 are wet-etched, and separates the second source S2 and the second drain D2. A passivation layer PAS covers the second TFT T2. A pixel electrode PXL may be formed on the passivation layer PAS.

The gate insulating layers GI1 and GI2, the interlayer insulating layers ILD, the etch stopper layer ES, and the passivation layer PAS may include at least one insulating material among $SiO_x$, $SiN_x$, $SiO_xN_y$, $AlO_x$, $HfO_x$, and $TiO_x$, but the present disclosure is not limited thereto. For example, the insulating materials may be an oxide, a nitride, or an oxynitride including at least one of Si, Ge, Al, Hf, Ti, In, Ga, Gd, La, and Ta. The gate insulating layers GI1 and GI2, the interlayer insulating layer ILD, and the passivation layer PAS may each be formed as a single layer of the aforementioned insulating material layer or may have a structure in which two or more of the aforementioned insulating material layers are stacked, and a thickness thereof may range from 100 Å to 7000 Å. The pixel electrode PXL may be formed of a transparent electrode material, for example, indium tin oxide (ITO).

The capacitance of the capacitor C may be increased using a stacked structure of the first and second TFTs T1 and T2. The capacitor C may be connected to one or more of the first and second TFTs T1 and T2 or may be separated therefrom. The capacitor C may be a storage capacitor Cst of a pixel or a capacitor of a driving circuit. In the following embodiment, the capacitor C will be described as a storage capacitor, but the present disclosure is not limited thereto.

The capacitor C includes at least first and second capacitors C1 and C2. The first and second capacitors C1 and C2 may be connected in parallel. The pixel electrode PXL may be connected to the capacitor C through third to fifth electrodes E3, E4, and E5.

The first capacitor C1 includes a first electrode E1 and a second electrode E2 that overlap each other with the interlayer insulating layer ILD interposed therebetween. The first gate G1 and the first electrode E1 may be simultaneously formed by depositing a first metal on the first gate insulating layer GI1 and patterning the first metal through a photo mask process. Also, the first source S1, the first drain D1, the second electrode E2, and a third electrode E3 may be simultaneously formed by depositing a second metal on the interlayer insulating layer ILD and patterning the second metal through a photo mask process. The third electrode E3 may be in contact with a fourth electrode E4 and also in contact with the first electrode E1 through a contact hole penetrating through the interlayer insulating layer ILD.

The second capacitor C2 includes the second electrode E2 and the fourth electrode E4 that overlap each other with the second buffer layer BUF2 interposed therebetween. The second gate G2 and the fourth electrode E4 may be simultaneously formed by depositing a third metal on the second buffer layer BUF2 and patterning the third metal through a photo mask process. The fourth electrode E4 is in contact with a fifth electrode E5 and also in contact with the third electrode E3 through a contact hole penetrating through the second buffer layer BUF2.

The second source S2, the second drain D2, and the fifth electrode E5 may be simultaneously formed by depositing a fourth metal on the etch stopper layer ES and patterning the fourth metal through a photo mask process. The fifth electrode E5 is in contact with the pixel electrode PXL and also in contact with the fourth electrode E4 through a contact penetrating through the passivation layer PAS. The pixel electrode PXL, the fifth electrode E5, the fourth electrode E4, the third electrode E3, and the first electrode E1 may be vertically connected in FIG. 3, but the present disclosure is not limited thereto. For example, contact positions of these electrodes PXL, E5, E4, E3, and E1 may be distributed on a plane, rather than overlapping each other.

Third Example Embodiment

FIG. 4 is a cross-sectional view illustrating a thin film transistor (TFT) substrate for a flat panel display according to a third example embodiment of the present invention.

With reference to FIG. 4, the TFT substrate for a flat panel display according to the third embodiment of the present disclosure includes a first TFT T1 disposed on a substrate SUBS and a second TFT T2 disposed on the first TFT T1. At least a portion of the second TFT T2 overlaps the first TFT T1 in a thickness direction or in a vertical direction (z).

A first semiconductor pattern ACT1 of the first TFT T1 includes a polycrystalline semiconductor material, such as LTPS. A first buffer layer BUF1 may be formed on the substrate SUBS, and the first semiconductor pattern ACT1 may be formed on the first buffer layer BUF1. A light shield layer may be formed between the substrate SUBS and the first buffer layer BUF1. The first TFT T1 includes a first gate G1 disposed on the first semiconductor pattern ACT1, a first source S1 in contact with a source region of the first semiconductor pattern ACT1, and a first drain D1 in contact with a drain region of the first semiconductor pattern ACT1. The first gate G1 overlaps the first semiconductor pattern ACT1 with a first gate insulating layer GI1 interposed therebetween. The first source S1 and the first drain D1 are separated from the first gate G1 with an interlayer insulating layer ILD and the first gate insulating layer GI interposed therebetween. The first source S1 and the first drain D1 are in contact with the first semiconductor pattern ACT1 through contact holes penetrating through the first interlayer insulating layer ILD and the first gate insulating layer GI. The second buffer layer BUF2 covers the first TFT T1 and planarizes a surface on which the second TFT T2 is formed.

The second semiconductor pattern ACT2 of the second TFT T2 includes an oxide semiconductor. The second TFT T2 includes a second gate G2 formed on the second gate insulating layer pattern GI2, a second source S2 in contact with a source region of the second semiconductor pattern ACT2, and a second drain D2 in contact with a drain region of the second semiconductor pattern ACT2. The second gate G2 overlaps the second semiconductor pattern ACT2 with the second gate insulating layer pattern GI2 interposed therebetween. The second gate G2 is disposed above the second semiconductor pattern ACT2. The second gate insulating layer pattern GI2 is formed on the second semiconductor pattern ACT2, and the second gate G2 is formed on the second gate insulating layer pattern GI2. The second interlayer insulating layer ILD2 covers the second semiconductor pattern ACT2 and the second gate G2. The second source S2 and the second drain D2 are in contact with the second semiconductor pattern ACT2 through contact holes penetrating through the second interlayer insulating layer ILD2. A passivation layer PAS covers the second TFT T2. A pixel electrode PXL may be formed on the passivation layer PAS.

One or more of the second source and the second drain of the second TFT T2 may be connected to the first TFT T1. In the example of FIG. 4, the second drain D2 of the second TFT T2 is connected to the source S1 of the first TFT T1, but the present disclosure is not limited thereto.

The gate insulating layers GI1 and GI2, the interlayer insulating layers ILD1 and ILD2, and the passivation layer PAS may include at least one insulating material among SiOx, SiNx, SiOxNy, AlOx, HfOx, and TiOx, but the present disclosure is not limited thereto. For example, the insulating materials may be an oxide, a nitride, or an oxynitride including at least one of Si, Ge, Al, Hf, Ti, In, Ga, Gd, La, and Ta. The gate insulating layers GI1 and GI2, the interlayer insulating layers ILD1 and ILD2, and the passivation layer PAS may each be formed as a single layer of the aforementioned insulating material layer or may have a structure in which two or more of the aforementioned insulating material layers are stacked, and a thickness thereof may range from 100 Å to 7000 Å. The pixel electrode PXL may be formed of a transparent electrode material, for example, indium tin oxide (ITO).

The capacitance of the capacitor C may be increased using a stacked structure of the first and second TFTs T1 and T2. The capacitor C may include at least first and second capacitors C1 and C2. The first and second capacitors C1 and C2 may be connected in parallel. In the examples of FIGS. 3 and 4, the capacitor C has a configuration in which the first and second capacitors C1 and C2 are stacked, but the present disclosure is not limited thereto. For example, in the capacitor C, three or more capacitors may be connected in parallel. The pixel electrode PXL may be connected to the capacitor C through third and fifth electrodes E3 and E5.

The first capacitor C1 includes a first electrode E11 and a second electrode E12 which overlap each other with the first interlayer insulating layer ILD1 interposed therebetween. In the present disclosure, the first gate G1 and the first electrode E11 may be simultaneously formed by depositing a first metal on the first gate insulating layer GI1 and patterning the first metal through a photo mask process. Also, in the present disclosure, the first source S1, the first drain D1, the second electrode E12, and a third electrode E13 may be simultaneously formed by depositing a second metal on the first interlayer insulating layer ILD1 and patterning the second metal through a photo mask process. The third electrode E13 may be in contact with the fifth electrode E15 and also in contact with the first electrode E11 through a contact hole penetrating through the first interlayer insulating layer ILD1.

The second capacitor C2 includes the second electrode E12 and the fifth electrode E15 that overlap each other with the second buffer layer BUF2, the second interlayer insulating layer ILD2, and the passivation layer PAS interposed therebetween. The second source S2, the second drain D2, and the fifth electrode E15 may be simultaneously formed by depositing a fourth metal on the second buffer layer BUF2 and patterning the fourth metal through a photo mask process. The fifth electrode E15 is in contact with the pixel electrode PXL and also in contact with the third electrode E13 through a contact hole penetrating through the second buffer layer BUF2 and the second interlayer insulating layer ILD2.

The pixel electrode PXL, the fifth electrode E15, the third electrode E13, and the first electrode E11 may be vertically connected in FIG. 4, but the present disclosure is not limited thereto. For example, contact positions of these electrodes PXL, E15, E13, and E11 may be distributed on a plane, rather than overlapping each other.

Figure 5:
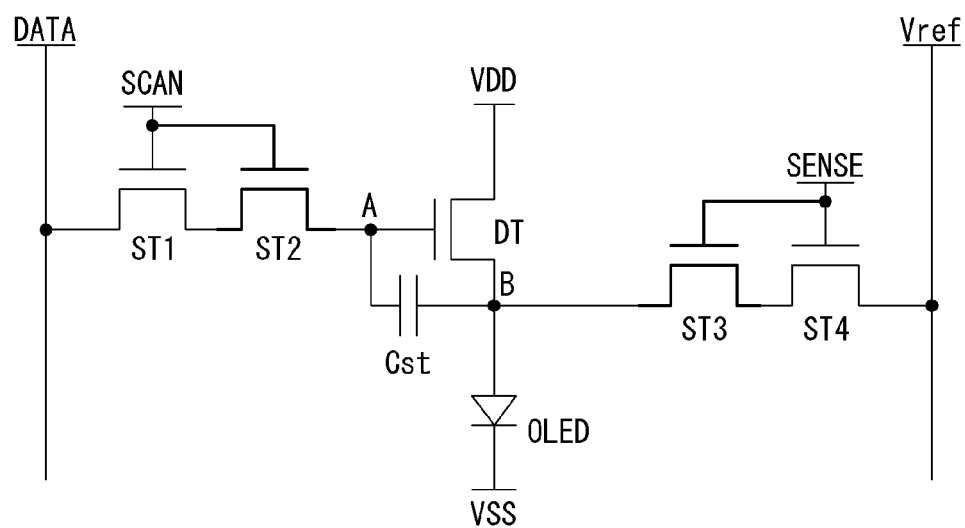
FIG. 5 is a circuit diagram illustrating an example of implementing a switching element of a pixel by combining first and second TFTs.

At least portions of the first TFT T1 and the second TFT T2 having the vertical stacked structure as illustrated in FIGS. 3 and 4 may be connected to implement a single switching element. FIG. 5 is a circuit diagram illustrating an example of implementing a switching element of a pixel by combining first and second TFTs.

With reference to FIG. 5, a pixel of an organic light emitting display device includes an organic light emitting diode (OLED), a storage capacitor, one or more switching elements ST1, ST2, ST3, and ST4, and a driving element DT. The driving element DT adjusts an amount of current flowing to the OLED according to a gate voltage applied through a first node. The driving element DT is maintained in an ON state while the OLED emits light, and therefore, the driving element DT may be driven for a long period of time. The driving element DT may be advantageously implemented as a first TFT T1 having a polycrystalline semiconductor pattern ACT1 because a polycrystalline semiconductor has high charge carrier mobility as compared to an oxide semiconductor. Because a data voltage is supplied to a first node A during an emission period, a gate voltage of the driving element DT is equal to the data voltage. A gate of the driving element DT is connected to the first node A. A drain of the driving element D1 is connected to a VDD line to receive a pixel driving voltage VDD. The pixel driving voltage VDD is a voltage higher than a low potential ground voltage VSS. A source of the driving element DT is connected to a second node B. An anode of the OLED is connected to the second node B, and a cathode thereof is connected to the VSS line to receive the low potential ground voltage.

The storage capacitor Cst is connected between the first node A and the second node B and maintains a voltage Vgs between the gate and the source of the driving element DT.

The first and second switching elements ST1 and ST2 supply a data voltage from a data line to the first node A in response to a scan signal. Any one of the first and second switching elements ST1 and ST2 may be implemented as a first TFT T1 and the other may be implemented as a second TFT T2. The OFF current of the oxide semiconductor pattern ACT2 of the second TFT T2 is low. Therefore, when the second TFT T2 is applied to the first and second switching elements ST1 and ST2 whose OFF state is considerably longer than ON state, power consumption may be reduced in a standby mode or during low speed driving, and a discharging path of the capacitor Cst may be cut off to further lower a refresh rate in low speed driving.

The first switching element ST1 includes a drain connected to the data line, a gate to which a scan signal SCAN is input, and a source connected to a drain of the second switching element ST2. The second switching element ST2 includes the drain connected to the source of the first switching element ST1, a gate to which the scan signal SCAN is input, and a source connected to the first node A. The gates of the first and second switching elements ST1 and ST2 are connected to the scan line through which the scan signal SCAN is applied. The first and second switching elements ST1 and ST2 are simultaneously turned on in response to the scan signal SCAN, operating as a single switching element. To supply the data voltage to a pixel, the first and second switching elements ST1 and ST2 are turned on for a very short period of time, relative to 1 horizontal period, and soon turned off and maintained in the OFF state for the most horizontal period. At least one of the first and second switching elements ST1 and ST2 is advantageously implemented as the second TFT T2 having low OFF current in terms of power consumption. Any one of the first and second switching elements ST1 and ST2 is advantageously implemented as the first TFT T1 having high mobility in terms of a response speed and driving reliability.

In response to a sensing signal, the third and fourth switching elements ST3 and ST4 supply a reference voltage or an initialization voltage to the second node B, and supply a voltage of the second node B to a sample & hold (not shown). The third and fourth switching elements ST3 and ST4, the sample & hold, and an analog-to-digital converter (ADC) constitute a sensing circuit sensing a change in characteristics of the driving element DT or the OLED. Any one of the third and fourth switching elements ST3 and ST4 may be implemented as a first TFT T1 and the other may be implemented as a second TFT T2. Since OFF current of the oxide semiconductor pattern ACT2 of the second TFT T2 is low, when the second TFT T2 is applied to the third and fourth switching elements ST3 and ST4 whose OFF state is considerably longer than its ON state, power consumption may be reduced in a standby mode or during low speed driving, and a discharging path of the capacitor Cst may be cut off to further lower a refresh rate in low speed driving.

The third switching element ST3 includes a drain connected to the second node A, a gate to which a sensing signal SENSE is input, and a source connected to a drain of the fourth switching element ST4. The fourth switching element ST4 includes a drain connected to the source of the source of the third switching element ST3, a gate to which the sensing signal SENSE is input, and a source connected to a reference voltage line. The gates of the third and fourth switching elements ST3 and ST4 are connected to a sensing control line to which the sensing signal SENSE is applied. The third and fourth switching elements ST3 and ST4 are simultaneously turned on in response to the sensing signal SENSE, serving as a single switching element. To supply a voltage of the second node B, the third and fourth switching elements ST3 and ST4 are turned on for a very short period of time, and maintained in an OFF state for the most period of time. At least one of the third and fourth switching elements ST3 and ST4 is advantageously implemented as the second TFT T2 having low OFF current in terms of power consumption. Any one of the third and fourth switching elements ST3 and ST4 is advantageously implemented as the first TFT T1 having high mobility in terms of a response speed and driving reliability.

The first and second TFTs T1 and T2 may be applied to various flat panel display devices as illustrated in FIGS. 6 through 12.

<Block Diagram of Example Display Structure>

Figure 6:
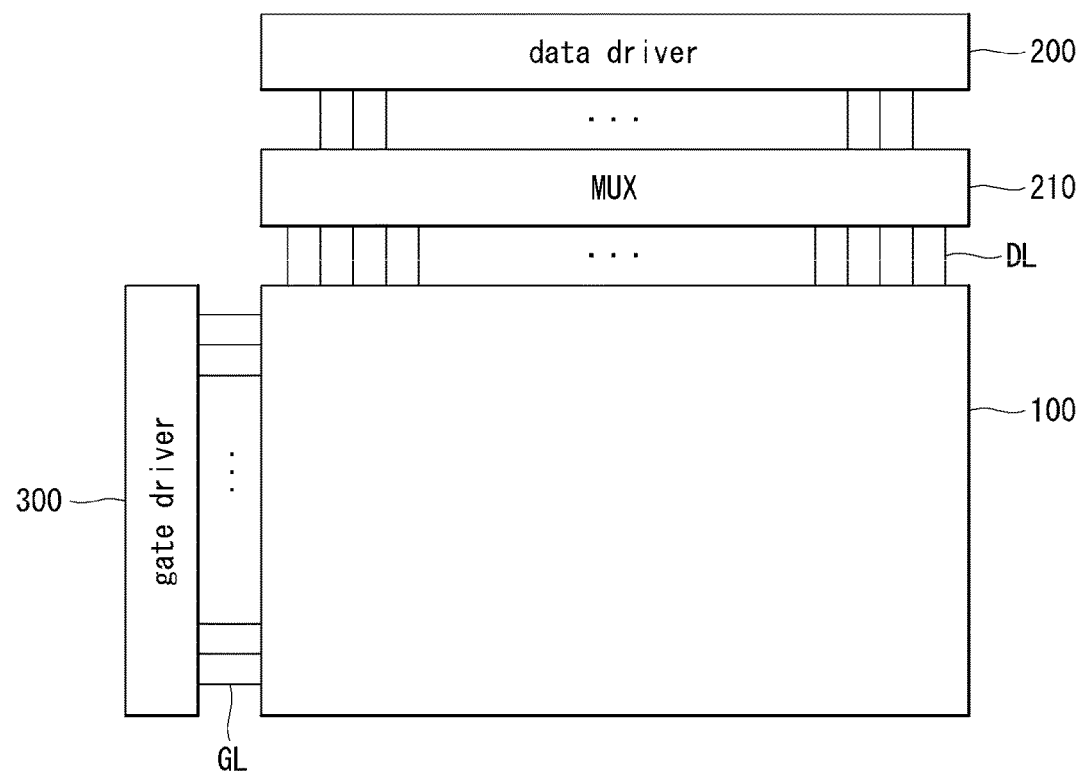
FIG. 6 is a block diagram illustrating a structure of the display according to example embodiments of the present invention.

The thin film transistor substrate having two different types of thin film transistors on the same substrate, as explained above, can be applied to various type display including a flat panel display, a flexible display and/or a curved display. By forming the two different types thin film transistors on the same substrate, various merits can be obtained. Hereinafter, with reference to FIG. 6, features and merits of thin film transistor substrates according to example embodiments of the present invention will be discussed. FIG. 6 is a block diagram illustrating a structure of the display according to example embodiments of the present invention.

With reference to FIG. 6, a display device of the present disclosure includes a display panel 100 displaying an input image on a pixel array and a display panel driving circuit writing data into the display panel 100. The display panel 100 may include touch sensors for sensing a touch input from a user. The display panel driving circuit includes a data driver 200, a multiplexer MUX 210, and a gate driver 300. The display panel driving circuit may further include a touch sensor driving circuit. Also, the display panel driving circuit may further include a timing controller for controlling an operational timing of the data driver 200, MUX 210, and gate driver 300.

The first and the second transistors T1 and T2 may be formed in each pixel of the display panel 100 for switching the data voltage applied to the pixel or for driving the pixel. For the case of an organic light emitting diode display, the second thin film transistor T2 may be a switch element for the pixel, and the first thin film transistor T1 may be a driver element. However, possible applications are not limited to this particular example. For example, by combining the first and the second thin film transistors T1 and T2, they may be configured to operate as one switch element or one driver element.

To reduce the power consumption in a mobile device or a wearable device, a relatively low speed driving method using a low frame rate is adopted. In this case, the frame frequency may be lowered for still image and/or the images having a slower update interval. Here, when the lower frame rate is used, at every time the data voltage changes, the brightness of the display may flash. In some cases, as the discharging time interval is elongated, the brightness may flicker at every data update period. By applying the first and the second thin film transistors T1 and T2 on the same substrate according to the present invention, the flicker problem at lower speed driving method can be prevented.

Also, in the lower speed driving method, as the data update period is elongated, the amount of leaked current of the switching thin film transistor may increase. The leaked current of the switching thin film transistor may cause a drop in the voltage of the storage capacitance and/or in the voltage between the gate and source of the driving thin film transistor. The second thin film transistor having the oxide semiconductor material can be used as the switching thin film transistor of the organic light emitting diode display. As a thin film transistor including an oxide semiconductor material has relatively low off-current characteristics, the drop in the voltage of the storage capacitance and/or in the gate-source voltage of the driving thin film transistor can be prevented or reduced. Thus, the flicker phenomenon resulting from the use of the lower speed driving method may be prevented or reduced.

As the polycrystalline silicon has the characteristics of high mobility, by using the first thin film transistor as the driving thin film transistor of the organic light emitting diode display, the current amount supplied to the organic light emitting diode can be increased. Therefore, implementing the second thin film transistor T2 as the switching thin film transistor and the first thin film transistor T1 as the driving thin film transistor, the organic light emitting diode display may have lower power consumption and better video quality.

As the thin film transistor substrate according to the present invention provides for excellent video quality without or with less flicker even at a relatively low speed driving, it is very suitable for use in the mobile display or the wearable display. For example of a wearable wrist watch, the video data may be updated at every one second for reducing the power consumption. In that case, the frame frequency is 1 Hz. The display according to the present invention can provide for excellent video quality with little to no flicker even though the video data is driven at a low frequency, such as 1 Hz or lower. Further, for the mobile display or the wearable display, the frame rate for the still image can be lower so that the power consumption can be reduced without degrading the video quality. As a result, the video quality of the mobile display and/or wearable display can be improved, and the life time of the battery can be increased. In addition, the display according to the present invention can be applied to electric book devices (or "E-Books") whose data update period is very long to reduce power consumption without degrading the video quality.

At least one of the first and the second thin film transistors T1 and T2 may be embedded into a driver circuit, for example as shown in FIG. 6, in one or more of the data driver 200, the multiplexer (MUX) 210, and the gate driver 300, that form a driver circuit. This driver circuit writes and/or applies the data voltage to the pixel. In another example, any one of the first and the second thin film transistors T1 and T2 may be disposed within a pixel in the display area, and the other disposed in the driver circuit in the non-display area. The data driver 200 converts the input video data into the voltage values and output the voltage values. The multiplexer 210 may reduce the number of output channels of the data driver 200, by distributing the data voltages from the data driver 200 to the data lines DL by a time-sharing or time-division method. The gate driver 300 outputs the scan signal (or gate signal) to the gate lines GL synchronized to the data voltage for sequentially selecting the pixel line where the data voltage is to be applied. To reduce the number of output channels of the gate driver 300, other multiplexers not shown in the figures may be further included between the gate driver 300 and the gate lines GL. The multiplexer 210 and the gate driver 300 may be formed on the same thin film transistor substrate with the pixel array 100, as shown in FIG. 6. The multiplexer 210 and the gate driver 300 may be disposed within the non-display area and the pixel array may be disposed within the display area of the thin film transistor substrate. In the pixel array, data lines and gate lines intersect with each other, and pixels are disposed in a matrix form. The gate lines include scan lines to which a gate signal or a scan signal is applied and a sensing line to which a sensing signal is applied. The non-display area NA includes a bezel area disposed outside of the pixel array.

The thin film transistor substrate according to the present invention may be applied to any type of display requiring an active matrix thin film transistor substrate such as the liquid crystal display, the organic light emitting diode display and/or the electrophoresis display device. Hereinafter, more example embodiments providing for more applications for the display using the thin film transistor substrate according to the present invention.

Fourth Example Embodiment

Figure 7:
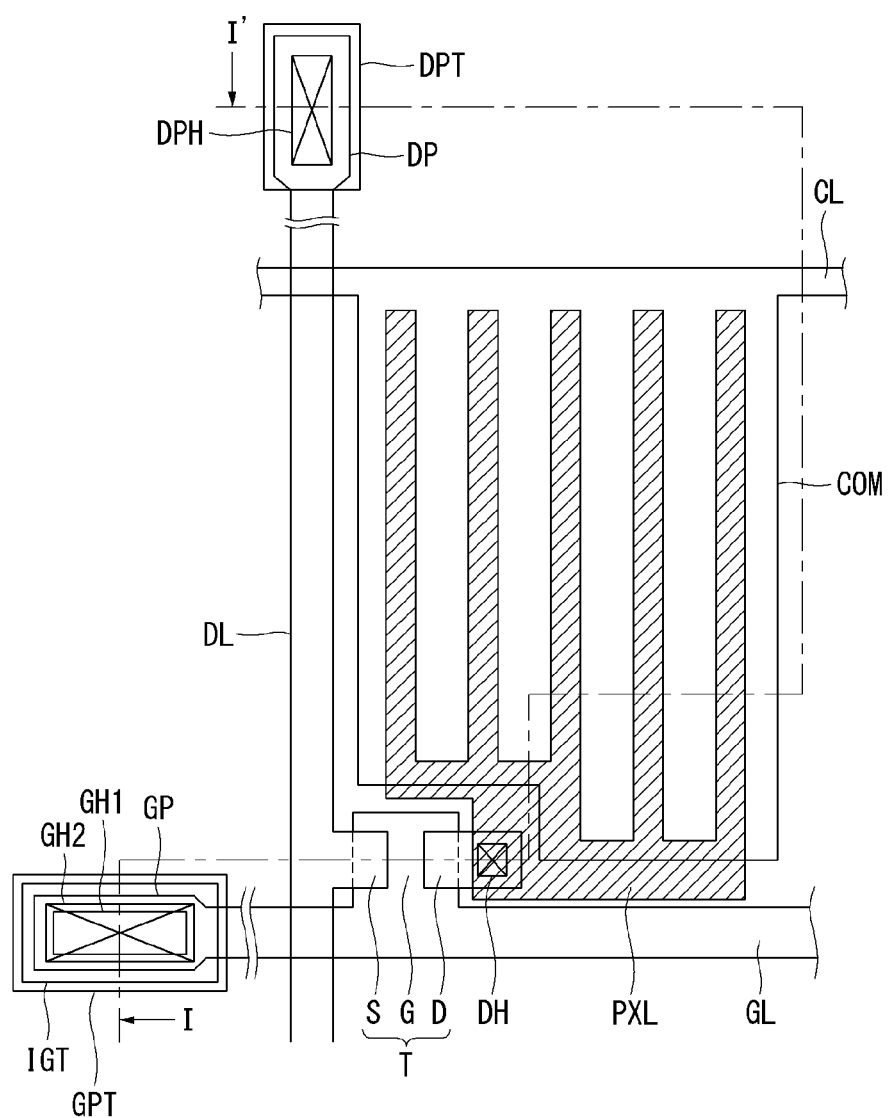
FIG. 7 is a plane view illustrating a thin film transistor substrate having an oxide semiconductor layer included in a fringe field type liquid crystal display according to a fourth example embodiment of the present invention.
Figure 8:
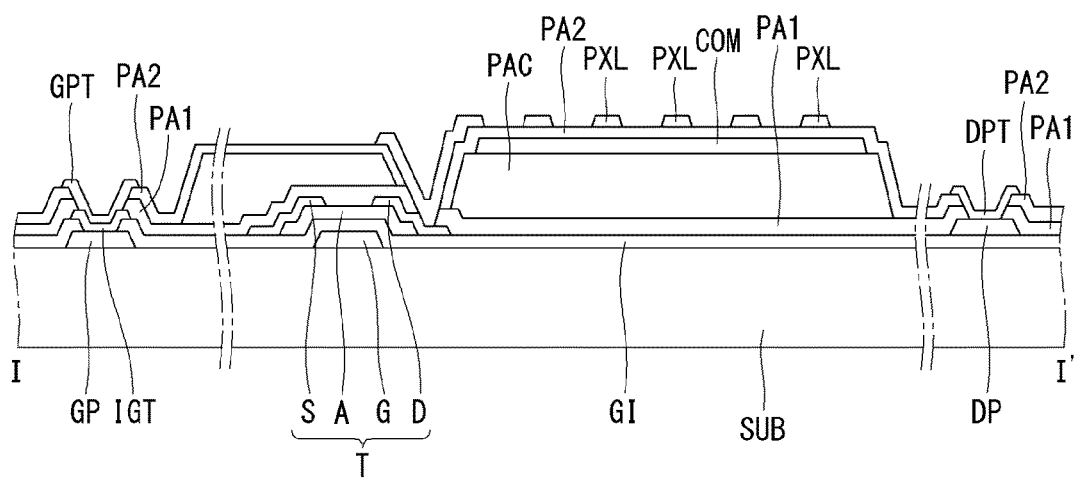
FIG. 8 is a cross-sectional view illustrating the structure of the thin film transistor substrate of FIG. 7 by cutting along line I-I' according to the fourth example embodiment of the present invention.

FIG. 7 is a plane view illustrating a thin film transistor substrate having an oxide semiconductor layer included in a fringe field type liquid crystal display according to a fourth example embodiment of the present invention. FIG. 8 is a cross-sectional view illustrating the structure of the thin film transistor substrate of FIG. 7 by cutting along line I-I' according to the fourth example embodiment of the present invention.

Figure 9:
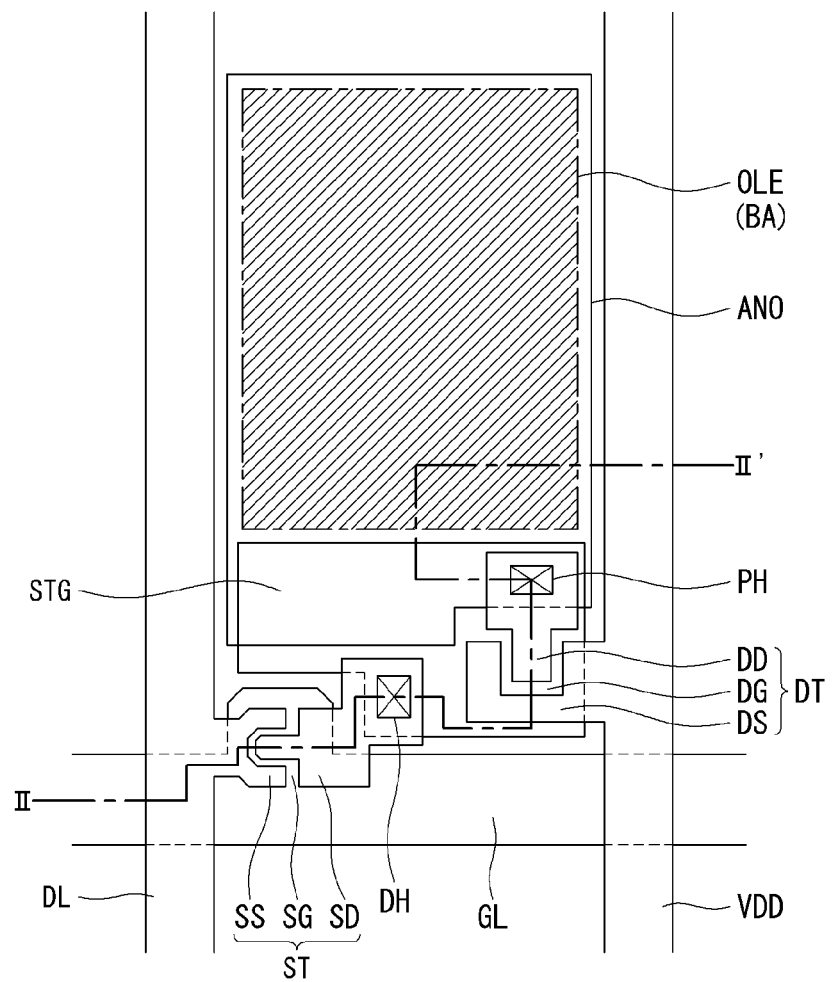
FIG. 9 is a plane view illustrating a structure of one pixel in an active matrix type organic light emitting diode display having the active switching elements, such as the thin film transistors, according to a fifth example embodiment of the present invention.

The thin film transistor substrate having a metal oxide semiconductor layer shown in FIGS. 7 and 9 comprises a gate line GL and a data line DL crossing each other with a gate insulating layer GI therebetween on a lower substrate SUB, and a thin film transistor T formed at the crossing portion. By the crossing structure of the gate line GL and the data line DL, a pixel area is defined.

The thin film transistor T comprises a gate electrode G branched (or protruded) from the gate line GL, a source electrode S branched from the data line DL, a drain electrode D separated the source electrode S, and a semiconductor layer A on the gate insulating layer GI and overlapping the gate electrode G for forming a channel area between the source electrode S and the drain electrode D.

At one end of the gate line GL, a gate pad GP is disposed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is disposed for receiving the pixel signal. The data pad DP is connected to a data pad terminal DPT through the data pad contact hole DPH penetrating the first passivation layer PA1 and the second passivation layer PA2.

In the pixel area, a pixel electrode PXL and a common electrode COM are formed with the second passivation layer PA2 therebetween to form a fringe electric field. The common electrode COM is connected to the common line CL disposed in parallel with the gate line GL. The common electrode COM is supplied with a reference voltage (or "common voltage") via the common line CL. In another example, the common electrode COM may have the one sheet electrode shape which covers the whole surface of the substrate SUB except the drain contact hole DH portions. That is, covering over the data line DL, the common electrode COM can work as a shielding means for the data line DL.

The common electrode COM and the pixel electrode PXL can have various shapes and positions according to the design purpose and environment. While the common electrode COM is supplied with a reference voltage having a constant value, the pixel electrode PXL is supplied with a data voltage that varies according to the video data. Therefore, between the data line DL and the pixel electrode PXL, a parasitic capacitance may be formed. Due to the parasitic capacitance, the video quality of the display may be degraded. Therefore, the common electrode COM may be disposed first, and the pixel electrode PXL may be disposed over the common electrode COM.

In other words, on the first passivation layer PA1 covering the data line DL and the thin film transistor T, a planarization layer PAC is stacked by thickly depositing an organic material having a low permittivity. Then, the common electrode COM is formed on the planarization layer PAC. And then, after depositing the second passivation layer PA2 to cover the common electrode COM, the pixel electrode PXL overlapping with the common electrode is formed on the second passivation layer PA2. In this structure, the pixel electrode PXL is far from the data line DL, separated by the first passivation layer PA1, the planarization layer PAC and the second passivation layer PA2, so that the parasitic capacitance between the data line DL and the pixel electrode PXL can be reduced. In another example, the pixel electrode PXL may be disposed first and the common electrode COM is disposed over the pixel electrode PXL.

The common electrode COM may have a rectangular shape corresponding to the pixel area. The pixel electrode PXL may have the shape of a plurality of segments. In particular, the pixel electrode PXL overlaps with the common electrode COM with the second passivation layer PA2 therebetween. Between the pixel electrode PXL and the common electrode COM, a fringe electric field is formed. By this fringe electric field, the liquid crystal molecules arranged in a plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent a desired gray scale.

In FIGS. 7 and 8 for explaining the fourth example embodiment of the present invention, for convenience, the thin film transistor T of the liquid crystal display is not shown in all possible detail. However, the first and/or the second thin film transistors T1 and/or T2 detailed in the first to third example embodiments of the present disclosure can be applied to this thin film transistor. For example, if a low speed driving is required, the second thin film transistor T2 having the oxide semiconductor material can be implemented as the thin film transistor T. For another example, if a low power consumption is required, the first thin film transistor T1 having the polycrystalline semiconductor material may be implemented as the thin film transistor T. For still another example, the thin film transistor T may be formed as including the first and the second thin film transistors T1 and T2 connected to each other so that the performance and the characteristics of both thin film transistors can compensate for and complement each other.

Fifth Example Embodiment

Figure 10:
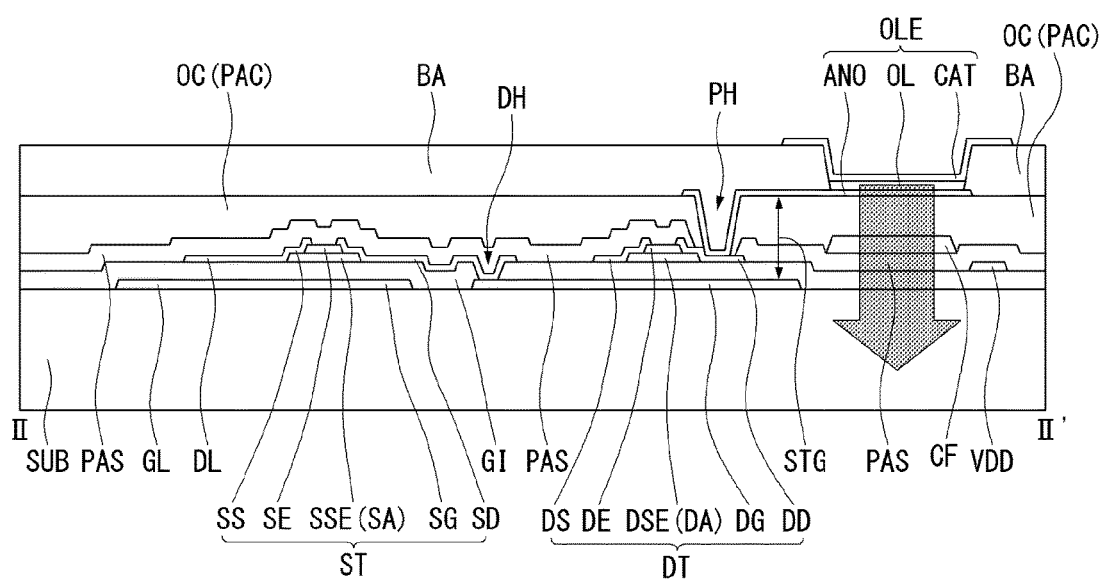
FIG. 10 is a cross sectional view illustrating the structure of the organic light emitting diode display along line II-IF in FIG. 9 according to the fifth example embodiment of the present invention.

FIG. 9 is a plane view illustrating a structure of one pixel in an active matrix type organic light emitting diode display having the active switching elements, such as the thin film transistors, according to a fifth example embodiment of the present invention. FIG. 10 is a cross sectional view illustrating the structure of the organic light emitting diode display along line II-II' in FIG. 9 according to the fifth example embodiment of the present invention.

As shown in FIGS. 9 and 10, the active matrix type organic light emitting diode display comprises a switching thin film transistor ST, a driving thin film transistor DT connected to the switching thin film transistor ST, and an organic light emitting diode OLE connected to the driving thin film transistor DT.

The switching thin film transistor ST is formed where a gate line GL and a data line DL cross each other on a substrate SUB. Supplying the data voltage from the data line DL to the gate electrode DG of the driving thin film transistor DT and to the storage capacitance STG in response to the scan signal, the switching thin film transistor ST serves a function of selects the pixel. The switching thin film transistor ST includes a gate electrode SG branching from the gate line GL, a semiconductor channel layer SA overlapping with the gate electrode SG, a source electrode SS and a drain electrode SD. Controlling the amount of the current applied to the organic light emitting diode OLE of the pixel according to the gate voltage, the driving thin film transistor DT serves a function of driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to a VDD line, and a drain electrode DD. The VDD line supplies a pixel driving voltage VDD to the pixels. The drain electrode DD of the driving thin film transistor DT is connected to the anode electrode ANO of the organic light emitting diode OLE. Between the anode electrode ANO and the cathode electrode CAT, an organic light emitting layer OL is disposed. The cathode electrode CAT is connected to the ground line VSS (not shown in FIG. 10).

As shown in FIG. 10 in more detail, on the substrate SUB of the active matrix organic light emitting diode display, the gate electrodes SG and DG of the switching thin film transistor ST and the driving thin film transistor DT, respectively are disposed. On the gate electrodes SG and DG, the gate insulator GI is deposited. On the gate insulator GI overlapping with the gate electrodes SG and DG, the semiconductor layers SA and DA are disposed, respectively. On the semiconductor layers SA and DA, the source electrodes SS and DS and the drain electrodes SD and DD, respectively separated from the source electrodes SS and DS, are disposed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

A color filer CF is disposed at the area where the anode electrode ANO is to be disposed. The color filter CF may have as large of an area as possible. For example, the color filter may overlap with as large of a portion of the data line DL, the VDD line and/or the gate line GL as possible. The upper surface of the substrate having these thin film transistors ST and DT and color filters CF may not be in even and/or smooth conditions, but in uneven and/or rugged conditions having many steps. For the organic light emitting diode display to have good luminescent quality over the whole display area, the organic light emitting layer OL should have an even or smooth surface. So, to make the upper surface more planar and even, the planar layer PAC or the over coat layer OC may be deposited on the whole surface of the substrate SUB.

Then, on the over coat layer OC, the anode electrode ANO of the organic light emitting diode OLED is disposed. Here, the anode electrode ANO is connected to the drain electrode DD of the driving thin film transistor DT through the pixel contact hole PH penetrating the over coat layer OC and the passivation layer PAS.

Figure 12:
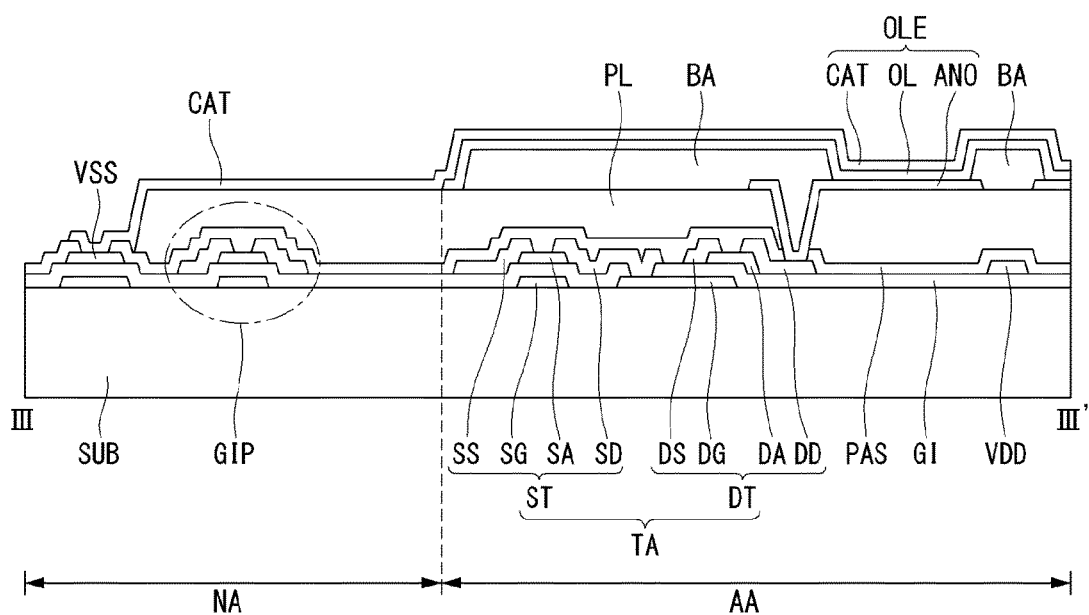
FIG. 12 is a cross sectional view illustrating a structure of the organic light emitting diode display along line in FIG. 11 according to the sixth example embodiment of the present invention.

On the substrate SUB having the anode electrode ANO, a bank (or a "bank pattern") BA is disposed over the area having the switching thin film transistor ST, the driving thin film transistor DT, and the various lines DL, GL and VDD for defining the pixel area. The portion of the anode electrode ANO exposed by the bank BA would be the light emitting area. On the anode electrode ANO exposed from the bank BA, the organic light emitting layer OL is deposited. On the organic light emitting layer OL, the cathode electrode ACT is deposited. For an example in which the organic light emitting layer OL has a material emitting white light, each pixel can represent various colors by the color filter CF disposed under the anode electrode ANO. The organic light emitting diode display as shown in FIG. 12 is the bottom emission type display in which the visible light is radiated toward the bottom direction of the display substrate.

Between the gate electrode DG of the driving thin film transistor DT and the anode electrode ANO, a storage capacitance STG may be formed. By being connected to the driving thin film transistor DT, the storage capacitance STG keeps the voltage supplied to the gate electrode DG of the driving thin film transistor DT from the switching thin film transistor ST stable.

By using the thin film transistor substrate according to the present invention and example embodiments as detailed above, an active type flat panel display having good properties can be provided. In particular, to provide for excellent driving properties, the active layer of the thin film transistor may include a metal oxide semiconductor material.

The metal oxide semiconductor material may have its characteristics degraded when it operates while being exposed to the light for a long time. Therefore, a structure may be included to block the light from entering the thin film transistor having a metal oxide semiconductor material from below or above the thin film transistor. For example, for the thin film transistor substrates detailed above, the thin film transistors may be formed in the bottom gate structure. That is, the light introduced from the outside of substrate, especially from the lower side of the substrate, can be blocked by the gate electrode G including an opaque metal material.

The thin film transistor substrate for the flat panel display has a plurality of pixel areas disposed in a matrix form. Further, each pixel area includes at least one thin film transistor. That is, a plurality of thin film transistors is disposed over the whole substrate. Because the plurality of pixel areas and the plurality of thin film transistors are used for the same purpose and should have the same quality and characteristics, they have the same structure.

However, in some cases, it may be desirable or necessary to provide the thin film transistors with different characteristics. For example of the organic light emitting diode display, in one pixel area, at least one switching thin film transistor ST and at least one driving thin film transistor DT are disposed. As the respective purposes of the switching thin film transistor ST and the driving thin film transistor DT are different from each other, their required characteristics are also different from each other. To accommodate these differences, the switch thin film transistor ST and the driving thin film transistor DT may have the same basic structure and the same semiconductor material, but their channel layers may have different sizes for optimizing their respective characteristics. Otherwise, a compensating thin film transistor may further be included for supporting any specific functions or properties of any thin film transistor.

In FIGS. 9 and 10 for explaining the fifth example embodiment of the present invention, for convenience, the switching thin film transistor ST and the driving thin film transistor DT of the organic light emitting diode display are not shown with all possible detail. However, the first and/or the second thin film transistors T1 and/or T2 detailed in the first to third example embodiments of the present invention can be applied to the thin film transistors ST and DT. For example, the second thin film transistor T2 having the oxide semiconductor material can be implemented as the switching thin film transistor ST. Also, the first thin film transistor T1 having the polycrystalline semiconductor material may be implemented as the driving thin film transistor DT. Therefore, by including the first and the second thin film transistors T1 and T2 on one substrate, their performance and the characteristics can compensate for and complement each other.

Sixth Example Embodiment

For still another example embodiment, a driver element (e.g., a driver IC) may be formed in the non-display area of the same thin film transistor substrate for the flat panel display as the pixel areas. Hereinafter, with reference to FIGS. 11 and 12, the thin film transistor substrate having the driver IC on the same substrate as the pixel areas.

Figure 11:
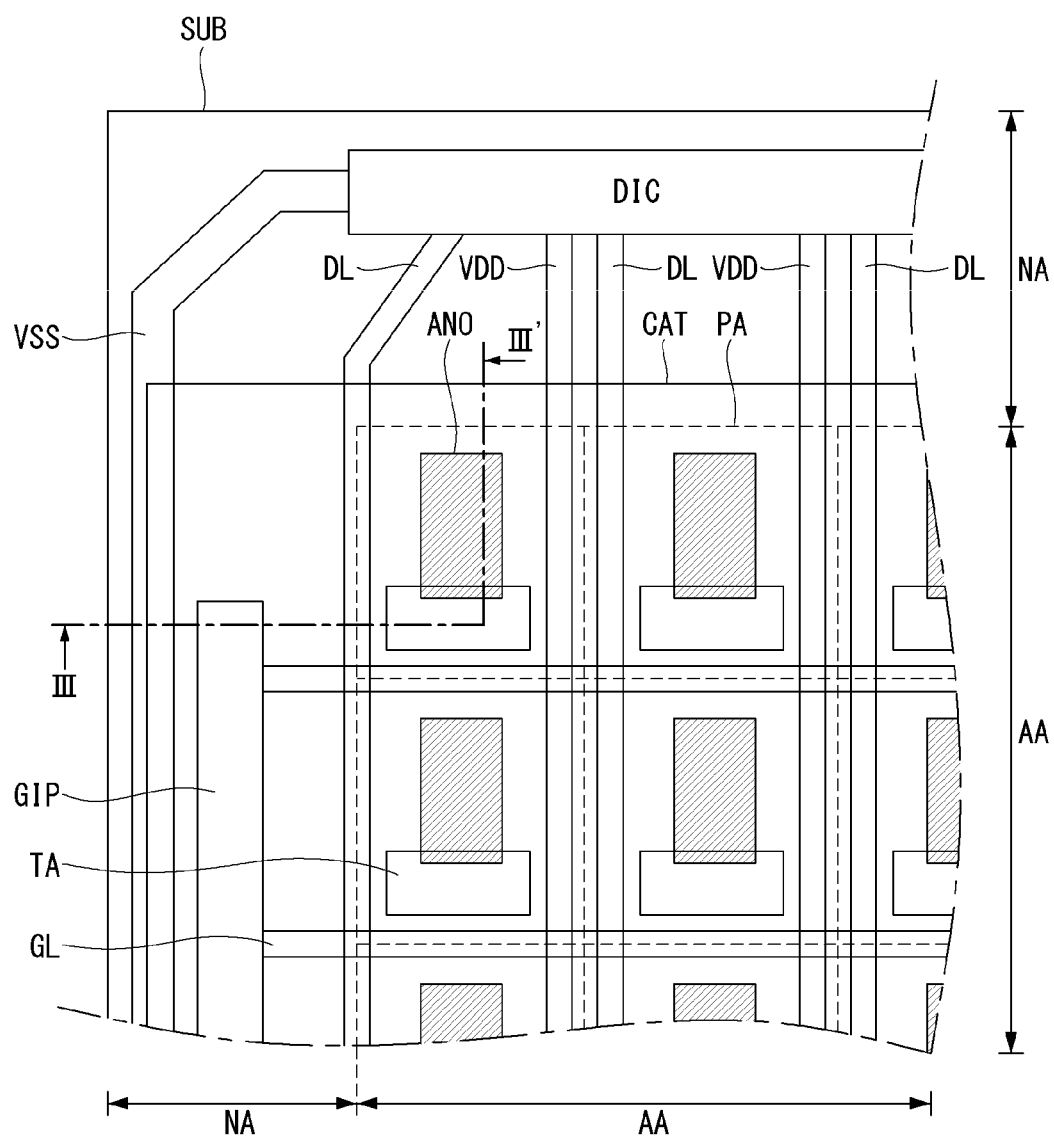
FIG. 11 is an enlarged plane view illustrating a structure of an organic light emitting diode display according to a sixth example embodiment of the present invention.

FIG. 11 is an enlarged plane view illustrating a structure of an organic light emitting diode display according to a sixth example embodiment of the present invention. FIG. 12 is a cross sectional view illustrating a structure of the organic light emitting diode display along line III-III' in FIG. 11 according to the sixth example embodiment of the present invention. Here, because the discussion focuses more on the driver element embedded in the thin film transistor substrate that also includes display elements, the detailed features of the thin film transistors and the organic light emitting diode in the pixel areas already discussed above may be omitted.

First, with reference to FIG. 11, the plane structure of the organic light emitting diode display according to the sixth example embodiment is discussed in detail. An organic light emitting diode display according to the sixth example embodiment comprises a base substrate SUB including a display area AA for displaying the video information and a non-display area NA having various elements for driving the elements in the display area AA. In the display area AA, a plurality of pixel areas PA disposed in a matrix form is defined. In FIG. 11, the pixel areas PA are illustrated with the dotted lines.

For example, the pixel areas PA can be defined as an N (row)×M (column) matrix. However, the disposed pattern is not restricted to this particular form, and may have various different shapes and forms. Each of the pixel areas PA may have the same size or a different size. With one unit pixel having at least three sub pixels including red (R), green (G) and blue (B) sub pixels, the unit pixels may be uniformly disposed. In a simple sense, the pixel areas PA can be defined by the crossing of a plurality of gate lines GL running in a horizontal direction and a plurality of data lines DL and VDD lines running in a vertical direction.

In the non-display area NA defined as the peripheral area surrounding the pixel area PA, a data driving integrated circuit DIC for supplying the video data to the data lines DL and a gate driving integrated circuit GIP for supplying the scan signal to the gate lines GL are disposed. For an example of a display panel with a higher resolution than the VGA, in which more data lines DL and more VDD lines are required, the data driving integrated circuit DIC may be installed external to the substrate SUB, and data contact pads may be disposed on the substrate SUB instead of the data driving integrated circuit DIC.

To simply show the structure of the display, the gate driving integrated circuit GIP is formed on one side portion of the substrate SUB directly. The ground line VSS for supplying a ground voltage (or reference voltage) may be disposed at an outer portion of the substrate SUB. The ground line VSS is disposed as to receive the ground voltage from external device located out of the substrate SUB, and to supply the ground voltage to the data driving integrated circuit DIC and the gate driving integrated circuit GIP. For example, the ground line VSS may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements such as an organic light emitting diode and thin film transistors for driving the organic light emitting diode are disposed. The thin film transistor is disposed at the thin film transistor area TA defined at one side of the pixel area PA. The organic light emitting diode includes an anode electrode ANO, a cathode electrode CAT and an organic light emission layer OL disposed between these two electrodes. The actual emission area is decided by the area of the organic light emission layer OL overlapping the anode electrode ANO.

The anode electrode ANO has a shape to occupy a portion of the pixel area PA and is connected to the thin film transistor formed in the thin film transistor area TA. The organic light emission layer OL is deposited on the anode electrode ANO. The cathode electrode CAT is deposited on the organic light emission layer OL so as to cover the whole surface of the display area AA having the pixel areas PA.

The cathode electrode CAT may go over the gate driving integrated circuit GIP and contact the ground line VSS disposed at the outer portion of the substrate SUB. In other words, the ground voltage can be supplied to the cathode electrode CAT through the ground line VSS. The cathode electrode CAT receives the ground voltage, and the anode electrode ANO receives the voltage corresponding to the video data. Based on the voltage difference between the cathode electrode CAT and the anode electrode ANO, the organic light emission layer OL radiates the light to represent the video information.

With further reference to FIG. 12, the cross-sectional structure of the organic light emitting diode display according to the sixth example embodiment is discussed in detail. On the base substrate SUB, a non-display area NA and a display area AA are defined. The non-display area NA includes the gate driving integrated circuit GIP and the ground line VSS. The display area AA includes a switching thin film transistor ST, a driving thin film transistor DT, and an organic light emitting diode OLE.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an isolated anode electrode ANO having a rectangular shape within the pixel area PA is disposed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited to define the emission area. By patterning the bank BA, the most center portions of the anode electrode ANO are exposed. On the exposed anode electrode ANO, an organic light emission layer OL is deposited. By depositing a transparent conductive material on the bank BA and the organic light emission layer OL, the cathode electrode CAT is stacked. The organic light emitting diode OLED including the anode electrode ANO, the organic light emission layer OL and the cathode electrode CAT is disposed.

In an example in which the organic light emission layer OL may generate white light, color filters CF may be further included to represent full color video information. In that example, the organic light emission layer OL may be deposited to cover the whole surface of the display area AA.

The cathode electrode CAT may extend over the gate driving integrated circuit GIP so that it may cover the display area AA and the non-display area NA and contact the ground line VSS disposed at the outer portion of the substrate SUB. As a result, the ground voltage (or a reference voltage) can be supplied to the cathode electrode CAT via the ground line VSS.

In addition, the ground line VSS may be formed at the same layer and made of the same material as the gate electrodes SG and DG. In that case, the cathode electrode CAT can be connected to the ground line VSS through the contact hole penetrating the passivation layer PAS and the gate insulating layer GI over the ground line VSS. Otherwise, the ground line VSS may be formed at the same layer and made of the same material as the source and drain electrodes SS, SD, DD, and DD. In this case, the cathode electrode CAT can be connected to the ground line VSS through the contact hole penetrating the passivation layer PAS over the ground line VSS.

In FIGS. 11 and 12 for explaining the sixth example embodiment of the present invention, for convenience, the switching thin film transistor ST and the driving thin film transistor DT of the organic light emitting diode display are not shown in detail. However, the first and/or the second thin film transistors T1 and/or T2 detailed in the fourth first to third example embodiments of the present invention can be applied to these thin film transistors. For example, the second thin film transistor T2 having the oxide semiconductor material can be implemented as the switching thin film transistor ST. The first thin film transistor T1 having the polycrystalline semiconductor material may be implemented as the driving thin film transistor DT. Further, for the gate driver IC GIP, the first thin film transistor T1 having the polycrystalline semiconductor material may be used. If required, for the gate driver IC GIP, the C-MOS type thin film transistor including P-MOS type and N-MOS type thin film transistors may be used.

It will be apparent to those skilled in the art that various modifications and variations can be made in the thin film transistor substrate and display device of the present invention without departing from the spirit or scope of the invention. Thus, it is intended that the present invention cover the modifications and variations of this invention provided they come within the scope of the appended claims and their equivalents.

What is claimed is:

1. A thin film transistor substrate, comprising:
   a base substrate;
   a first thin film transistor (TFT) including a polycrystalline semiconductor and disposed on the base substrate; and
   a second TFT including an oxide semiconductor and disposed on the first TFT,
   wherein the second TFT overlaps at least a portion of the first TFT in a plan view, and
   wherein the first TFT includes:
      a first semiconductor pattern having the polycrystalline semiconductor;
      a first gate insulating layer on the first semiconductor pattern;
      a first gate on the first gate insulating layer;
      a first interlayer insulating layer covering an upper surface of the first gate and contacting a side surface of the first gate;
      a first source and a first drain formed on the first interlayer insulating layer; and
      a buffer layer on the first interlayer insulating layer to cover the first source and the first drain, and
   wherein the second TFT comprises:
      a second gate on the buffer layer;
      a second gate insulating layer on the buffer layer to cover the second gate;
      a second semiconductor pattern on the second gate insulating layer to overlap the second gate, and having the oxide semiconductor;
      an etch stopper layer on the second gate insulating layer to cover the second semiconductor pattern;
      a second source and a second drain in contact with the second semiconductor pattern through contact holes penetrating through the etch stopper layer; and
      a passivation layer on the etch stopper layer to cover the second source and the second drain.

2. The thin film transistor substrate of claim 1, wherein the second TFT is disposed on any one of the first source and the first drain of the first TFT.

3. The thin film transistor substrate of claim 1, further comprising a first light shield layer between the base substrate and the first TFT, wherein the first light shield layer is below the first TFT and the second TFT.

4. The thin film transistor substrate of claim 3, further comprising another buffer layer covering the first light shield layer,
   wherein the first semiconductor pattern is on the another buffer layer,
   wherein the first source and the first drain are in contact with the first semiconductor pattern through contact holes penetrating through the first interlayer insulating layer, and
   wherein any one of the first source and the first drain extends to a lower side of the second TFT to be integrated with a second light shield layer positioned below the second TFT.

5. The thin film transistor substrate of claim 1, further comprising another buffer layer covering the base substrate,
wherein the first semiconductor pattern is on the another buffer layer, and
wherein the first source and the first drain are in contact with the first semiconductor pattern through contact holes penetrating through the first interlayer insulating layer and the first gate insulating layer.

6. The thin film transistor substrate of claim 1, further comprising:
a capacitor,
wherein the capacitor comprises:
a first capacitor including a first electrode and a second electrode that overlap each other with the first interlayer insulating layer interposed therebetween; and
a second capacitor including the second electrode and a fourth electrode that overlap each other with the buffer layer interposed therebetween.

7. The thin film transistor substrate of claim 6, further comprising:
a fifth electrode in contact with the fourth electrode through a contact hole penetrating through the second gate insulating layer and the etch stopper layer; and
a pixel electrode in contact with the fifth electrode through a contact hole penetrating through the passivation layer.

8. A display device, comprising:
a display panel configured to display an input image; and
a display panel driving circuit configured to output data to the display panel,
wherein the display panel comprises:
a substrate;
a first thin film transistor (TFT) having a polycrystalline semiconductor and disposed on the substrate; and
a second TFT having an oxide semiconductor and disposed on the first TFT, wherein the second TFT overlaps at least a portion of the first TFT in a plan view, wherein the first TFT includes:
a first semiconductor pattern having the polycrystalline semiconductor;
a first gate insulating layer on the first semiconductor pattern;
a first gate on the first gate insulating layer;
a first interlayer insulating layer covering an upper surface of the first gate and contacting a side surface of the first gate;
a first source and a first drain formed on the first interlayer insulating layer; and
a buffer layer on the first interlayer insulating layer to cover the first source and the first drain, and
wherein the second TFT comprises:
a second gate on the buffer layer;
a second gate insulating layer on the buffer layer to cover the second gate;
a second semiconductor pattern on the second gate insulating layer to overlap the second gate, and having the oxide semiconductor;
an etch stopper layer on the second gate insulating layer to cover the second semiconductor pattern;
a second source and a second drain in contact with the second semiconductor pattern through contact holes penetrating through the etch stopper layer; and
a passivation layer on the etch stopper layer to cover the second source and the second drain.

9. The display device of claim 8, wherein the second TFT is on any one of the first source and the first drain of the first TFT.

10. The display device of claim 8, further comprising a first light shield layer disposed between the substrate and the first TFT, wherein the first light shield layer is below the first TFT and the second TFT.

11. The display device of claim 10, wherein the display panel further comprises another buffer layer covering the first light shield layer,
wherein the first semiconductor pattern is on the another buffer layer,
wherein the first source and the first drain are in contact with the first semiconductor pattern through contact holes penetrating through the first interlayer insulating layer, and
wherein any one of the first source and the first drain extends to a lower side of the second TFT to be integrated with a second light shield layer positioned below the second TFT.

12. The display device of claim 11, wherein the second TFT comprises:
a second semiconductor pattern on the buffer layer to overlap the second light shield layer and having the oxide semiconductor;
a second gate on the second semiconductor pattern;
a second gate insulating layer between the second semiconductor pattern and the second gate;
a second interlayer insulating layer covering the second gate and the second semiconductor pattern;
a second source and a second drain in contact with the second semiconductor pattern through contact holes penetrating through the second interlayer insulating layer; and
a passivation layer on the second interlayer insulating layer to cover the second source and the second drain.

13. The display device of claim 8, wherein the display panel further comprises another buffer layer covering the substrate,
wherein the first semiconductor pattern is on the another buffer layer,
wherein the first source and the first drain are in contact with the first semiconductor pattern through contact holes penetrating through the first interlayer insulating layer and the first gate insulating layer.

* * * * *